United States Patent
Choi et al.

(10) Patent No.: US 11,515,472 B2
(45) Date of Patent: Nov. 29, 2022

(54) MULTI-RESISTANCE MRAM

(71) Applicant: SanDisk Technologies LLC, Addison, TX (US)

(72) Inventors: Young-Suk Choi, Los Gatos, CA (US); Won Ho Choi, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 10 days.

(21) Appl. No.: 17/109,291

(22) Filed: Dec. 2, 2020

(65) Prior Publication Data

US 2021/0083173 A1    Mar. 18, 2021

Related U.S. Application Data

(60) Division of application No. 16/449,895, filed on Jun. 24, 2019, now Pat. No. 10,886,459, which is a
(Continued)

(51) Int. Cl.
*G11C 7/00* (2006.01)
*G11C 11/14* (2006.01)
*H01L 43/02* (2006.01)
*H01L 43/08* (2006.01)
*H01L 27/22* (2006.01)
*G11C 11/16* (2006.01)
(Continued)

(52) U.S. Cl.
CPC .............. *H01L 43/02* (2013.01); *G06N 3/04* (2013.01); *G06N 3/063* (2013.01); *G11C 11/005* (2013.01); *G11C 11/161* (2013.01); *G11C 11/1675* (2013.01); *G11C 11/54* (2013.01); *H01L 27/222* (2013.01); *H01L 43/08* (2013.01); *G11C 11/401* (2013.01)

(58) Field of Classification Search
CPC ....... H01L 43/02; H01L 27/222; H01L 43/08; G11C 11/005; G11C 11/161; G11C 11/1675; G11C 11/54; G11C 11/401
See application file for complete search history.

(56) References Cited

U.S. PATENT DOCUMENTS 7,108,797 B2   9/2006 Chen et al.
7,423,849 B2   9/2008 Gill
(Continued)

OTHER PUBLICATIONS

Lequeux, et al., "A magnetic synapse: multilevel spin-torque memristor with perpendicular anisotropy," Scientific Reports, Aug. 19, 2016, [https://www.nature.com/articles/srep31510], 7 pages.
(Continued)

*Primary Examiner* — Hien N Nguyen
(74) *Attorney, Agent, or Firm* — Vierra Magen Marcus LLP

(57) ABSTRACT

Apparatuses, systems, and methods are disclosed for magnetoresistive random access memory. A magnetic tunnel junction (MTJ) for storing data may include a reference layer. A free layer of an MTJ may be separated from a reference layer by a barrier layer. A free layer may be configured such that one or more resistance states for an MTJ correspond to one or more positions of a magnetic domain wall within the free layer. A domain stabilization layer may be coupled to a portion of a free layer, and may be configured to prevent migration of a domain wall into the portion of the free layer.

19 Claims, 17 Drawing Sheets

Related U.S. Application Data division of application No. 15/959,837, filed on Apr. 23, 2018, now Pat. No. 10,374,148, which is a continuation-in-part of application No. 15/891,370, filed on Feb. 8, 2018, now Pat. No. 10,381,548.

(51) Int. Cl.
| | |
|---|---|
| *G06N 3/063* | (2006.01) |
| *G06N 3/04* | (2006.01) |
| *G11C 11/00* | (2006.01) |
| *G11C 11/54* | (2006.01) |
| *G11C 11/401* | (2006.01) |

(56) References Cited

U.S. PATENT DOCUMENTS

| | | | |
|---|---|---|---|
| 7,514,271 | B2 | 4/2009 | Gaidis et al. |
| 8,164,861 | B2 | 4/2012 | Braganca et al. |
| 8,687,414 | B2 | 4/2014 | Nagahara et al. |
| 10,026,478 | B1 | 7/2018 | Choi et al. |
| 10,192,789 | B1 | 1/2019 | Sharma et al. |
| 10,229,723 | B1 | 3/2019 | Choi et al. |
| 10,374,148 | B1 | 8/2019 | Choi et al. |
| 10,381,548 | B1 | 8/2019 | Choi et al. |
| 10,528,643 | B1 | 1/2020 | Choi et al. |
| 2009/0243008 | A1 | 10/2009 | Kitagawa et al. |
| 2010/0046288 | A1* | 2/2010 | Honjou .......... H01L 43/12 365/158 |
| 2010/0315854 | A1* | 12/2010 | Suzuki .......... G11C 11/1673 365/171 |
| 2011/0267879 | A1 | 11/2011 | Nagahara et al. |
| 2013/0223141 | A1 | 8/2013 | Ranjan et al. |
| 2013/0336045 | A1 | 12/2013 | Kuo et al. |
| 2014/0010004 | A1 | 1/2014 | Suzuki |
| 2014/0062530 | A1 | 3/2014 | Miao et al. |
| 2015/0041935 | A1 | 2/2015 | Wang et al. |
| 2018/0166197 | A1 | 6/2018 | Wang |
| 2019/0229260 | A1 | 7/2019 | Wang et al. |
| 2019/0312195 | A1 | 10/2019 | Choi et al. |
| 2019/0312196 | A1 | 10/2019 | Choi et al. |

OTHER PUBLICATIONS

Sengupta, Abhronil, et al., "Proposal for an All-Spin Artifical Neural Network: Emulating Neural and Synaptic Functionalities Through Domain Wall Motion in Ferromagnets," arXiv.org, Feb. 3, 2016, [https://arxiv.org/abs/1510.00459], 9 pages.

International Search Report & The Written Opinion of the International Searching Authority dated Mar. 27, 2019, International Application No. PCT/US2018/064711.

U.S. Appl. No. 15/891,370, filed Feb. 8, 2018.

Restriction Requirement dated Sep. 11, 2018, U.S. Appl. No. 15/891,370, filed Feb. 8, 2018.

Response to Restriction Requirement dated Nov. 13, 2018, U.S. Appl. No. 15/891,370, filed Feb. 8, 2018.

Notice of Allowance dated May 3, 2019, U.S. Appl. No. 15/891,370, filed Feb. 8, 2018.

U.S. Appl. No. 15/959,837, filed Apr. 23, 2018.

Restriction Requirement dated Sep. 26, 2018, U.S. Appl. No. 15/959,837, filed Apr. 23, 2018.

Response to Restriction Requirement dated Nov. 26, 2018, U.S. Appl. No. 15/959,837, filed Apr. 23, 2018.

Notice of Allowance dated May 6, 2019, U.S. Appl. No. 15/959,837, filed Apr. 23, 2018.

U.S. Appl. No. 16/449,876, filed Jun. 24, 2019.

Restriction Requirement dated Jul. 14, 2020, U.S. Appl. No. 16/449,876, filed Jun. 24, 2019.

Response to Restriction Requirement dated Aug. 25, 2020, U.S. Appl. No. 16/449,876, filed Jun. 24, 2019.

Notice of Allowance dated Oct. 23, 2020, U.S. Appl. No. 16/449,876, filed Jun. 24, 2019.

Restriction Requirement dated Jul. 14, 2020, U.S. Appl. No. 16/449,895, filed Jun. 24, 2019.

Response to Restriction Requirement dated Aug. 25, 2020, U.S. Appl. No. 16/449,895, filed Jun. 24, 2019.

Notice of Allowance dated Sep. 3, 2020, U.S. Appl. No. 16/449,895, filed Jun. 24, 2019.

* cited by examiner

1270a

| Co | 1202a |
| Pt | 1204a |
| ⋮ | |
| Co | 1202b |
| Pt | 1204b |

| Co | 1202a |
| Pd | 1206a |
| ⋮ | |
| Co | 1202b |
| Pd | 1206b |

MULTI-RESISTANCE MRAM

CLAIM OF PRIORITY

This is a divisional application of U.S., patent application Ser. No. 16/449,895, entitled, "MULTI-RESISTANCE MRAM," filed Jun. 24, 2019, published as US 2019/0312196 on Oct. 10, 2019 and issued as U.S. Pat. No. 10,889,459 on Jan. 5, 2021, which is a divisional application of U.S. patent application Ser. No. 15/959,837, entitled, "MULTI-RESISTANCE MRAM," filed Apr. 23, 2018, and issued as U.S. Pat. No. 10,374,148 on Aug. 6, 2019, which is a continuation-in-part of U.S. patent application Ser. No. 15/891,370, entitled "MULTI-RESISTANCE MRAM" filed Feb. 8, 2018, and issued as U.S. Pat. No. 10,381,548 on Aug. 13, 2019, all of which are incorporated herein by reference.

TECHNICAL FIELD

The present disclosure, in various embodiments, relates to magnetoresistive random access memory and more particularly relates to multi-resistance magnetoresistive random access memory.

BACKGROUND

Various types of magnetoresistive random access memory (MRAM) store data using magnetic tunnel junctions. A magnetic tunnel junction (MTJ) may include "fixed" and "free" magnetic layers, where a magnetic moment of the free layer may be switched to be parallel or antiparallel to a magnetic moment of the fixed layer. A thin dielectric or barrier layer may separate the fixed and free layers, and current may flow across the barrier layer due to quantum tunneling. A difference in resistance between parallel and antiparallel states allows data to be stored. For example, a low resistance may correspond to a binary "1" and a high resistance may correspond to a binary "0," Alternatively, a low resistance may correspond to a binary "0" and a high resistance may correspond to a binary "1." However, a memory device that uses an array of MTJs to store one bit of data per MTJ may have a low storage density, or a low capacity for the area the array occupies.

SUMMARY

Apparatuses are presented for magnetoresistive random access memory. In one embodiment, a magnetic tunnel junction (MTJ) for storing data includes a reference layer. In a certain embodiment, a magnetic tunnel junction includes a free layer separated from a reference layer by a barrier layer. In a further embodiment, a free layer may be configured such that one or more resistance states for an MTJ correspond to one or more positions of a magnetic domain wall within the free layer. In certain embodiments, a domain stabilization layer may be coupled to a portion of a free layer, and may be configured to prevent migration of a domain wall into the portion of the free layer.

Systems are presented for neuromorphic computing. In one embodiment, a system includes a neuromorphic computing die. In a certain embodiment, a neuromorphic computing die includes a plurality of artificial neurons and a synapse array of multi-state magnetic memory cells coupling the artificial neurons. In a further embodiment, a multi-state magnetic memory cell includes a fixed layer. In one embodiment, a multi-state magnetic memory cell includes a magnetic storage layer separated from a fixed layer by a barrier layer. In a certain embodiment, a magnetic storage layer may be configured such that one or more states for a multi-state magnetic memory cell correspond to one or more positions of a magnetic domain wall within the magnetic storage layer. In a further embodiment, a domain stabilization layer may be coupled to a portion of a magnetic storage layer, and may be configured to provide a fixed magnetization for the portion of the magnetic storage layer.

An apparatus, in another embodiment, includes means for moving a magnetic domain wall in a free layer for a magnetic tunnel junction. In a certain embodiment, an apparatus includes means for preventing a magnetic domain wall from entering a portion of a free layer.

In another embodiment, a magnetoresistive random access memory die includes a plurality of memory cells. In one embodiment, a memory cell includes a fixed layer, a barrier layer, and a free layer. In a further embodiment, a barrier layer is disposed between a fixed layer and a free layer. A free layer, in one embodiment, includes a wall extension region configured to provide a plurality of resistance states for a memory cell corresponding to positions of a magnetic domain wall within the wall extension region. In a further embodiment, a free layer includes an end region configured to exclude a domain wall.

Methods are presented for magnetoresistive random access memory. A method, in one embodiment, includes applying a first write current to a magnetic tunnel junction, to move a magnetic domain wall to a pinning site in a wall extension region of a free layer of the magnetic tunnel junction. In a certain embodiment, a method includes applying a second write current to a magnetic tunnel junction to move a domain wall from a pinning site to a boundary between a wall extension region and an end region of a free layer. In a further embodiment, a method includes applying a third write current to a magnetic tunnel junction to move a domain wall back to a pinning site.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 12A is a schematic block diagram illustrating one embodiment of a domain stabilization layer;

FIG. 12B is a schematic block diagram illustrating another embodiment of a domain stabilization layer;

FIG. 12C is a schematic block diagram illustrating another embodiment of a domain stabilization layer;

DETAILED DESCRIPTION

Figure 1:
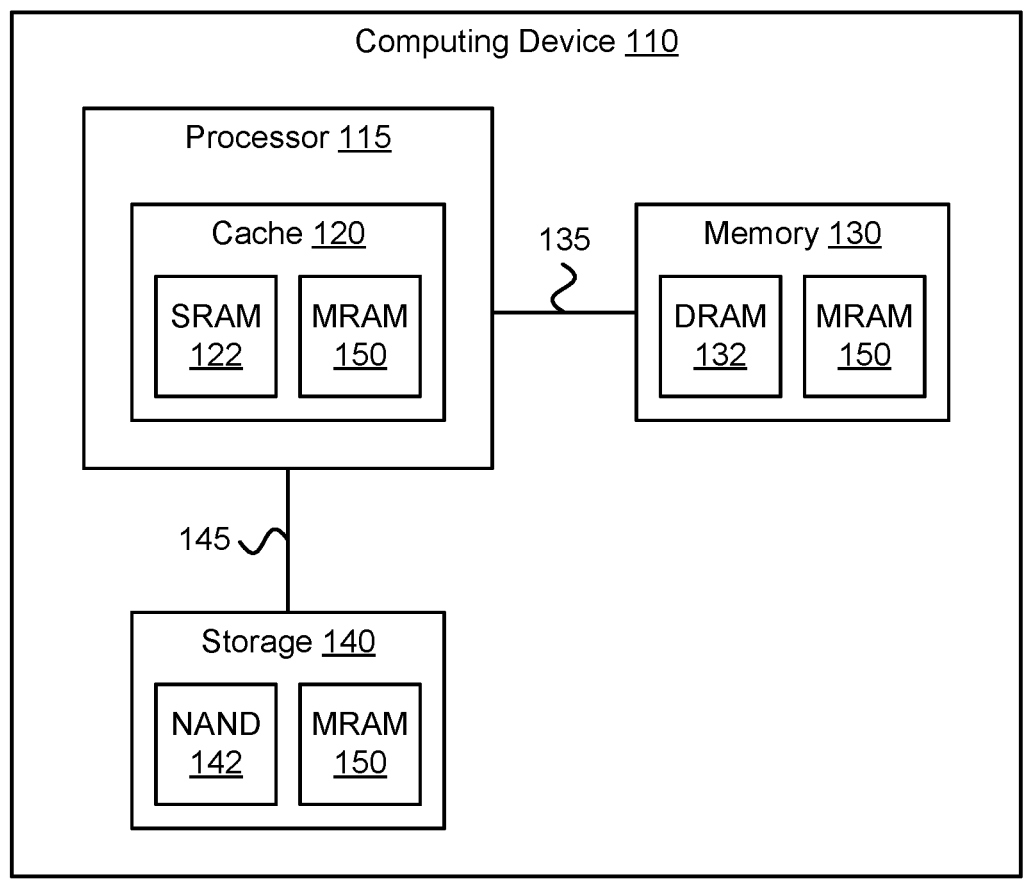
FIG. 1 is a schematic block diagram of one embodiment of a system comprising magnetoresistive random access memory (MRAM)

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 depicts a system 100 comprising magnetoresistive random access memory (MRAM) 150. In the depicted embodiment, the system includes a computing device 110. In various embodiments, a computing device 110 may be any electronic device capable computing by performing arithmetic or logical operations on electronic data. For example, a computing device 110 may be a server, a workstation, a desktop computer, a laptop computer, a tablet, a smartphone, a control system for another electronic device, a network attached storage device, a block device on a storage area network, a router, a network switch, or the like. In certain embodiments, a computing device 110 may include a non-transitory, computer readable storage medium that stores computer readable instructions configured to cause the computing device 110 to perform steps of one or more of the methods disclosed herein.

In the depicted embodiment, the computing device 110 includes a processor 115, a memory 130, and storage 140. In various embodiments, a processor 115 may be any electronic element that carries out the arithmetic or logical operations performed by the computing device. For example, in one embodiment, the processor 115 may be a general-purpose processor that executes stored program code. In another embodiment, a processor 115 may be a field-programmable gate array (FPGA), an application-specific integrated circuit (ASIC), or the like, that operates on data stored by the memory 130 and/or the storage 140. In a certain embodiment, a processor 115 may be a controller for a storage device (e.g., on a storage area network) a networking device, or the like.

In the depicted embodiment, the processor 115 includes a cache 120. In various embodiments, a cache 120 may store data for use by the processor 115. In certain embodiments, a cache 120 may be smaller and faster than the memory 130, and may duplicate data in frequently-used locations of the memory 130, or the like. In certain embodiments, a processor 115 may include a plurality of caches 120. In various embodiments, a cache 120 may include one or more types of memory media for storing data, such as static random access memory (SRAM) 122, magnetoresistive random access memory (MRAM) 150, or the like. For example, in one embodiment, a cache 120 may include SRAM 122. In another embodiment, a cache 120 may include MRAM 150. In a certain embodiment, a cache 120 may include a combination of SRAM 122, MRAM 150, and/or other memory media types.

The memory 130, in one embodiment, is coupled to the processor 115 by a memory bus 135. In certain embodiments, the memory 130 may store data that is directly addressable by the processor 115. In various embodiments, a memory 130 may include one or more types of memory media for storing data, such as dynamic random access memory (DRAM) 132, MRAM 150, or the like. For example, in one embodiment, a memory 130 may include DRAM 132. In another embodiment, a memory 130 may include MRAM 150. In a certain embodiment, a memory 130 may include a combination of DRAM 132, MRAM 150, and/or other memory media types.

The storage 140, in one embodiment, is coupled to the processor 115 by a storage bus 145. In certain embodiments, the storage bus 145 may be a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In various embodiments, the storage 140 may store data that is not directly addressable by the processor 115, but that may be accessed via one or more storage controllers. In certain embodiments, the storage 140 may be larger than the memory 130. In various embodiments, a storage 140 may include one or more types of storage media for storing data, such as a hard disk drive, NAND flash memory 142, MRAM 150, or the like. For example, in one embodiment, a storage 140 may include NAND flash memory 142. In another embodiment, a storage 140 may include MRAM 150. In a certain embodiment, a storage 140 may include a combination of NAND flash memory 142, MRAM 150, and/or other storage media types.

In various embodiments, MRAM 150 may be used to store data in a cache 120, memory 130, storage 140, and/or another component that stores data. For example, in the depicted embodiment, the computing device 110 includes MRAM 150 in the cache 120, memory 130, and storage 140. In another embodiment, a computing device 110 may use MRAM 150 for memory 130, and may use other types of memory or storage media for cache 120 or storage 140. Conversely, in another embodiment, a computing device 110 may use MRAM 150 for storage 140, and may use other types of memory media for cache 120 and memory 130. Additionally, some types of computing device 110 may include memory 130 without storage 140 (e.g., in a microcontroller) if the memory 130 is non-volatile, may include memory 130 without a cache 120 for specialized processors 115, or the like. Various combinations of cache 120, memory 130, and/or storage 140, and uses of MRAM 150 for cache 120, memory 130, storage 140, and/or other applications will be clear in view of this disclosure.

In various embodiments, the MRAM 150 may include one or more chips, packages, die, or other integrated circuit devices comprising magnetoresistive memory, disposed on one or more printed circuit boards, storage housings, and/or other mechanical and/or electrical support structures. For example, one or more dual inline memory modules (DIMMs), one or more expansion cards and/or daughter cards, a solid-state-drive (SSD) or other storage device, and/or another memory and/or storage form factor may comprise the MRAM 150. The MRAM 150 may be integrated with and/or mounted on a motherboard of the computing device 110, installed in a port and/or slot of the computing device 110, installed on a different computing device 110 and/or a dedicated storage appliance on a network, in communication with a computing device 110 over an external bus, or the like.

The MRAM 150, in various embodiments, may include one or more MRAM die, including a plurality of magnetic tunnel junctions (MTJs) for storing data. In certain embodiments, an MTJ includes a reference layer, a barrier layer, and a free layer. In further embodiments, a free layer may include a nucleation region and one or more arms. A nucleation region may be configured to form a magnetic domain wall, and an arm may include a plurality of pinning sites formed at predetermined locations along the arm for pinning the domain wall. In certain embodiments, an MTJ that includes a nucleation region and one or more arms with pinning sites may provide intermediate resistance states between a low resistance or parallel state and a high resistance or antiparallel state. In further embodiments, an MTJ or magnetic memory cell that provides more than two resistance states, or magnetization states, may be used to store more than one bit of data. For example, an MTJ that provides four resistance states may store two bits of data, so that the four states correspond to binary numbers 00, 01, 10, and 11. Similarly, an MTJ that provides eight resistance states may store three bits of data; an MTJ that provides sixteen resistance states may store four bits of data, and so on. MRAM 150 is described in further detail below with regard to FIGS. 2 through 10.

Figure 2:
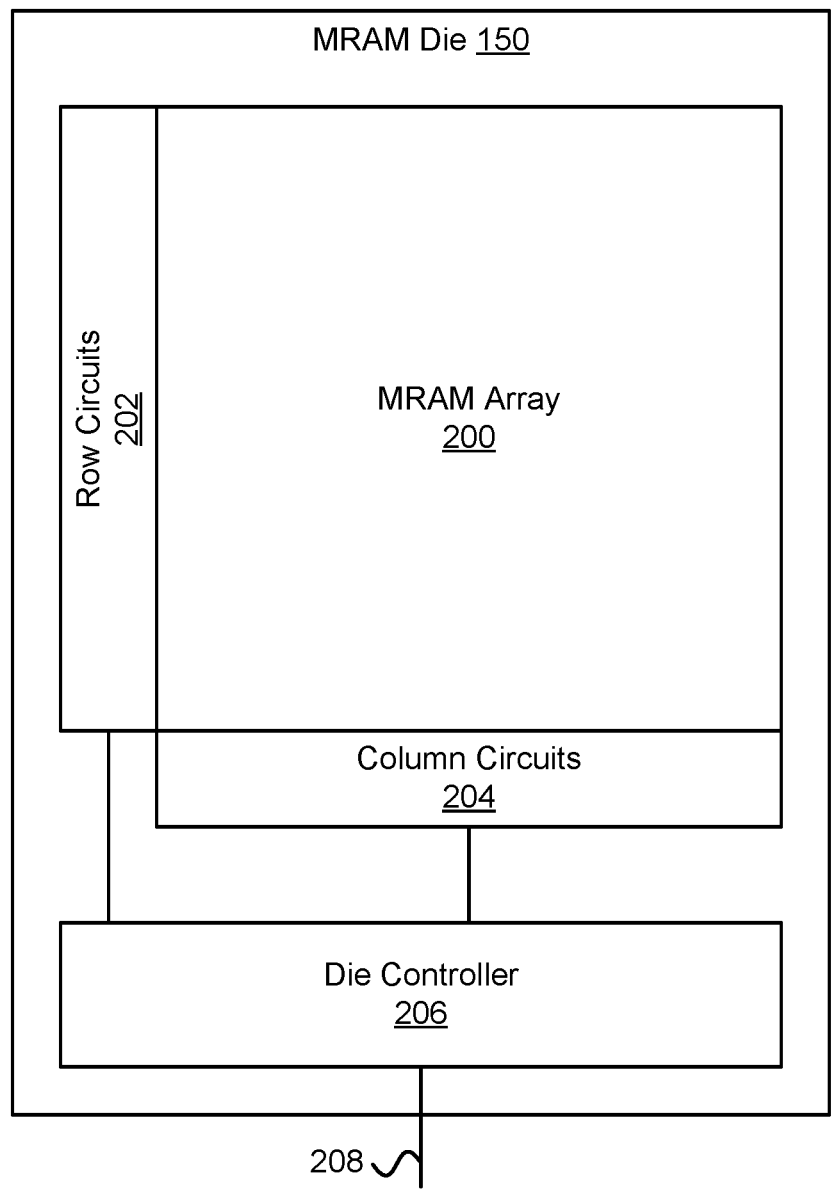
FIG. 2 is a schematic block diagram illustrating one embodiment of an MRAM die.

FIG. 2 depicts one embodiment of an MRAM die 150. The MRAM die 150 may be substantially similar to the MRAM 150 described with reference to FIG. 1. The MRAM die 150, in the depicted embodiment, includes an array 200 of MRAM cells, row circuits 202, column circuits 204, and a die controller 206.

In various embodiments, an MRAM die 150 may be an integrated circuit that includes both a core array 200 of memory cells (e.g., MTJs) for magnetoresistive data storage, and peripheral components (e.g., row circuits 202, column circuits 204, and/or die controller 206) for communicating with the array 200. In certain embodiments, one or more MRAM die 150 may be included in a memory module, a storage device, or the like.

In the depicted embodiment, the array 200 includes a plurality of memory cells (e.g., MRAM cells, MTJs, or the like). In one embodiment, the array 200 may be a two-dimensional array. In another embodiment, the array 200 may be a three-dimensional array that includes multiple planes and/or layers of MRAM cells. In various embodiments, the array 200 may be addressable by rows via row circuits 202, and by columns via column circuits 204.

The die controller 206, in certain embodiments, cooperates with the row circuits 202 and the column circuits 204 to perform memory operations on the array 200. In various embodiments, the die controller 206 may include components such as a power control circuit that controls the power and voltages supplied to the row circuits 202 and column circuits 204 during memory operations, an address decoder that translates a received address to a hardware address used by the row circuits 202 and column circuits 204, a state machine that implements and controls the memory operations, and the like. The die controller 206 may communicate with a computing device 110, a processor 115, a bus controller, a storage device controller, a memory module controller, or the like, via bus 208, to receive command and address information, transfer data, or the like.

Figure 3:
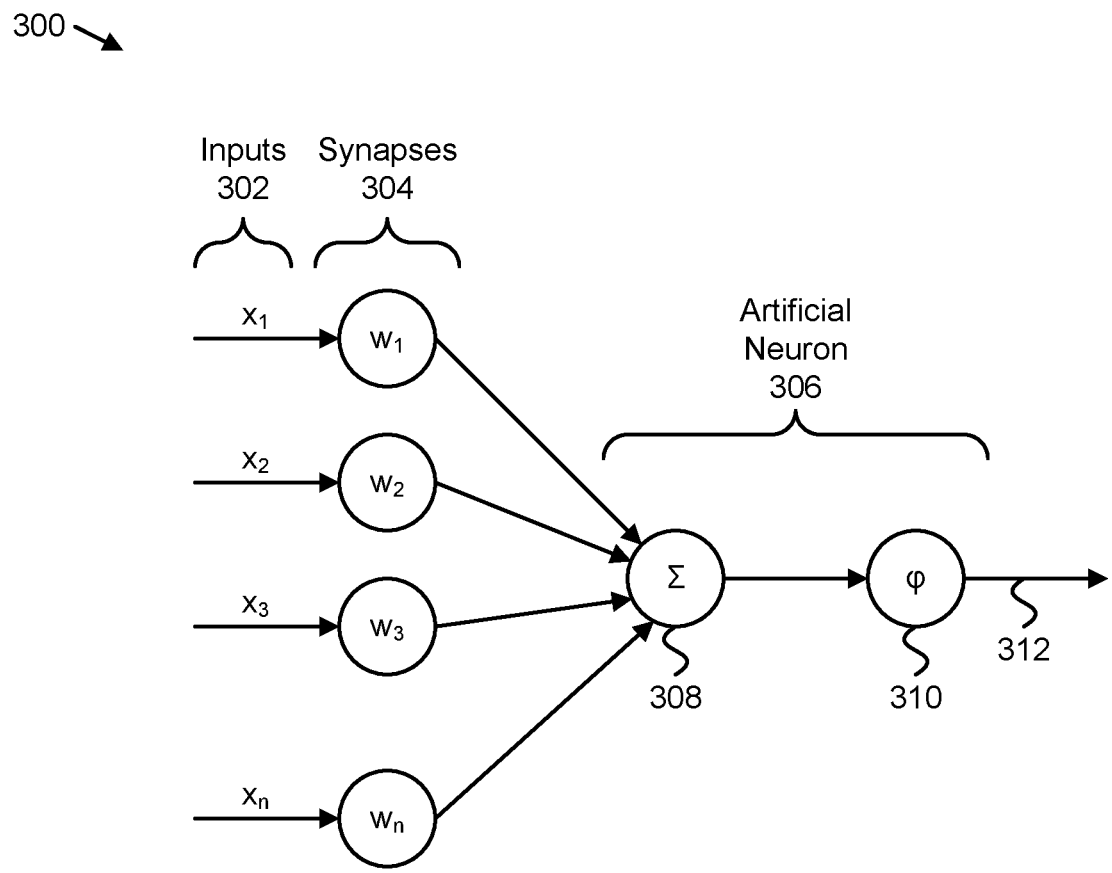
FIG. 3 is a schematic block diagram illustrating a portion of an artificial neural network, in one embodiment.

FIG. 3 depicts a portion 300 of an artificial neural network, in one embodiment. In the depicted embodiment, a portion 300 of an artificial neural network includes an artificial neuron 306, and a plurality of synapses 304. Arrows in FIG. 3 represent the flow of information, from inputs 302 on the left, to an output 312 on the right.

In various embodiments, an artificial neuron 306 may be analogous to a biological neuron. A biological neuron may include a plurality of dendrites that receive excitatory or inhibitory signals across synapses, weighted by synaptic neurotransmitters, a soma where ions corresponding to the weighted excitatory or inhibitory signals mix, and an axon that transmits an output signal based on an electrical potential of the mixed ions. Similarly, an artificial neuron 306 may produce a signal at an output 312 (analogous to a biological axon) based on a summation of weighted inputs 302 (where the inputs are analogous to biological dendrites and the weighting is analogous to biological synapses).

In various embodiments, an artificial neural network may include a plurality of interconnected artificial neurons 306, analogous to interconnected biological neurons in a brain or nervous system. In various embodiments, artificial neurons 306 may receive inputs 302 from other artificial neurons 306 and/or from external sources. Similarly, the output 312 of an artificial neuron 306 may be provided to an external component, or may be provided to one or more further artificial neurons 306. Thus, the depicted portion 300, including an artificial neuron 306 and synapses 304 may be repeated many times in an artificial neural network.

In the depicted embodiment, the inputs 302 may receive binary or analog signals $x_1$ through $x_n$ from other artificial neurons 306, or from sources external to an artificial network. For example, in one embodiment, an input 302 may receive a signal to be processed by artificial neural network. In a further embodiment, an input 302 may receive a signal from another artificial neuron 306. In a certain embodiment, an input 302 may be a bias input that is set to a fixed bias level (or to 1, so that the bias level is controlled by a synapse 304. Inputs 302 may be electrical lines, optical lines, or any other hardware capable of conveying the input signals $x_1$ through $x_n$.

Synapses 304, in various embodiments, provide weighted input signals to the artificial neuron 306. For example, the synapses 304 may provide a plurality of weights $w_1$ through $w_n$ that are multiplied by corresponding input signals $x_1$ through $x_n$, so that the artificial neuron 306 receives a first weighted input $w_1 x_1$, a second weighted input $w_2 x_2$, and so on. In one embodiment, synapses 304 may include latches, registers, SRAM memory cells, volatile memory cells, non-volatile memory cells, or any other hardware capable of storing weights $w_1$ through $w_n$. In one embodiment, a synapse 304 may further include logic hardware for multiplying the input signals $x_1$ through $x_n$ by the weights $w_1$ through $w_n$. In another embodiment, the synapses 304 may store the weights, and the multiplication may be performed by logic hardware separate from the synapses 304, such as a processor 115, an FPGA, an ASIC, a state machine, or the like. In another embodiment, the inputs $x_1$ through $x_n$ may be binary inputs, or may be converted to binary by comparison to a threshold, and a synapse 304 for input $x_k$ may output a weight $w_k$ (e.g., the weight $w_k$ may be read from a synapse 304 storage location) if the input is 1, or may output a 0 (e.g., a read operation for synapse 304 storage locations does not read from that synapse 304) if the input is zero. Various further types and configurations of hardware for synapses 304 will be clear in view of this disclosure.

In the depicted embodiment, the artificial neuron 306 includes a summation component 308. The summation component 308, in various embodiments, may receive and sum the weighted input signals $w_1 x_1$ through $w_n x_n$. The summation component 308 may include an adder, or any other hardware capable of summing inputs, or may be implemented by a processor 115 executing code. In a further embodiment, the artificial neuron 306 includes an activation component 310 that produces a signal at the output 312 based on the summed weighted input signals. The activation component 310 may output a function of the summed weighted input signals, such as a step function (for a perceptron), a sigmoid function (for a sigmoid neuron), a rectified linear function (for a ReLU neuron), or another non-linear function. In certain embodiments, the activation component 310 may produce an output signal as a function of the summed weighted input signals and of time. For example, the activation component 310 may output a spike that decays back to zero. The activation component 310 may include a comparator or other logic hardware to produce the output signal, or may be implemented by a processor 115 executing code. Various types and configurations of hardware for summation components 308 and activation components 310 will be clear in view of this disclosure.

In certain embodiments, an artificial neural network may include many portions similar to the depicted portion 300. For example, an artificial neural network may include a plurality of artificial neurons 306, and synapses 304 that store weights for couplings between artificial neurons 306. For example, in one embodiment, an artificial neural network may include a number N of artificial neurons 306, and an array of N*N synapses 304 that store weights for couplings between artificial neurons 306. A weight of zero may be equivalent to two corresponding artificial neurons 306 not being coupled together. A neuromorphic computing die may include artificial neurons 306 and an array of synapses 304.

Figure 4:
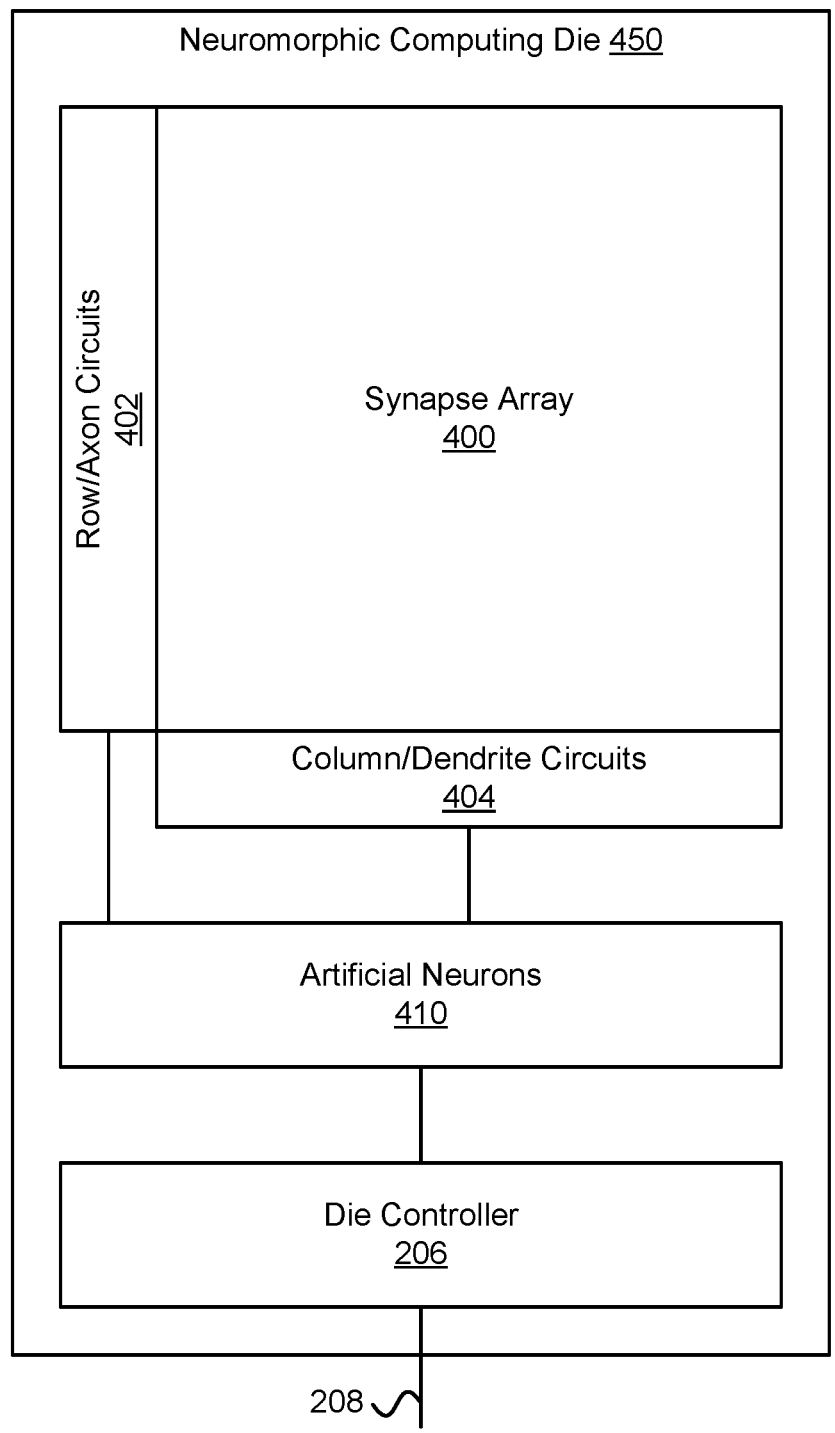
FIG. 4 is a schematic block diagram illustrating one embodiment of a neuromorphic computing die.

FIG. 4 depicts one embodiment of a neuromorphic computing die 450. The neuromorphic computing die 450, in the depicted embodiment, includes a synapse array 400, row/axon circuits 402, column/dendrite circuits 404, a plurality of artificial neurons 410, and a die controller 206.

In various embodiments, the neuromorphic computing die 450 may be an integrated circuit that includes artificial neurons 410 and a synapse array 400, and peripheral circuits (e.g., row/axon circuits 402, column/dendrite circuits 404, and/or die controller 206) for computing using the artificial neurons 410. In various embodiments, one or more neuromorphic computing dies 450 may be included in a computing device 110, and may be used in place of, or in addition to, a processor 115.

A plurality of artificial neurons 410, in certain embodiments, may be substantially similar to the artificial neurons 306 described above with reference to FIG. 3, including summation components 308 and activation components 310. Similarly, the synapse array 400 may be an array of synapses 304, substantially as described above with reference to FIG. 3. The synapses 304 may store weights for connections between neurons 410. For example, a synapse 304 in row i and column j of the array 400 may store a weight that couples the output 312 (or axon) of neuron i to an input 302

(or dendrite) of neuron j. Thus, rows of the synapse array 400 may correspond to outputs 312 or axons, and columns of the array 400 may correspond to inputs 302 or dendrites. The synapse array 400 may be addressable by rows via row/axon circuits 402, and by columns via column/dendrite circuits 404. In one embodiment, the row/axon circuits 402 and column/dendrite circuits 404 may be substantially similar to the row circuits 202 and column circuits 204 of the MRAM die 150 described above with reference to FIG. 2. In a further embodiment, the synapse array 400, row/axon circuits 402, and column/dendrite circuits 404 may be transposable, so that a row of weights or a column of weights may be read or written together.

The die controller 206, may be substantially similar to the die controller 206 described above with reference to FIG. 2, and may communicate with a computing device 110, a processor 115, a bus controller, or the like, via bus 208, to receive commands and transfer data.

In various embodiments, the neuromorphic computing die 450 may compute by receiving inputs for the artificial neurons 410 via the bus 208, processing the inputs through a network of neurons 410 interconnected by synapses 304 of the synapse array 400 (as described above with reference to FIG. 3), and providing outputs via the bus 208. The die controller 206 may receive the inputs, provide the outputs, and may control the row/axon circuits 402 and column/dendrite circuits 404 to access or modify weights stored by the synapse array 400. The die controller 206 may modify weights according to a learning algorithm, or may use existing weights for computation.

As used herein, the term "neuromorphic" may refer to artificial neurons 410, to components associated with artificial neurons 410, such as synapses 304, or a synapse array 400, and to systems, apparatuses, or methods that include or use artificial neurons 410 for computation. Thus, referring to a computing die 450 as "neuromorphic" may indicate that the neuromorphic computing die uses an artificial neural network for computing instead of, or in addition to, logic hardware that executes instructions. Similarly, a "neuromorphic" computing array may include artificial neurons 410 and synapses 304 coupling the neurons, whether on a neuromorphic computing die 150, or as part of another computing device.

In general, in various embodiments, a neuromorphic computing device may compute by processing signals through a network of interconnected artificial neurons 410. Thus, the transformation of input signals to output signals may be based on the type and number of neurons 410, the connections between those neurons 410, and the synaptic weights stored in the synapse array 400. A neuromorphic computing device may be programmed by setting synaptic weights. In certain embodiments, a die controller 206 may apply a learning algorithm to iteratively set and adjust synaptic weights in the synapse array 400.

In certain embodiments, a synapse array 400 may be an array of storage cells or MRAM cells substantially similar to a storage array (e.g., the MRAM array 200 of FIG. 2). A synapse 304 may be a storage cell or set of storage cells that stores a synaptic weight, and may be said to "couple" two artificial neurons 306 if the output signal of one artificial neuron 306 is multiplied by the stored synaptic weight and provided as an input signal to another artificial neuron 306. Thus, a synapse 304 may be referred to as "coupling" two artificial neurons 306 based on a physical configuration that physically couples the output 312 of one artificial neuron 306 to an input 302 of another artificial neuron 306 via the synapse 304, or based on a logical configuration that references the synapse 304 when propagating an output signal of one artificial neuron 306 as an input signal to another artificial neuron 306. For example, a die controller 206 may read a synaptic weight from a synapse 304 at row i and column j of the synapse array 400, multiply the synaptic weight by the output signal of neuron i, and provide the weighted signal as an input signal to neuron j. The synapse 304 at row i and column j may then be referred to as "coupling" neuron i and neuron j, regardless of whether the synapse 304 is physically coupled to those artificial neurons 306.

A multi-weight synapse 304, in various embodiments, may be a synapse 304 that stores or represents multiple intermediate weight states between a lowest weight state and a highest weight state. Increasing the number of possible states, or possible synaptic weights per synapse 304 may increase computing capacity, robustness, and precision, for a given number of artificial neurons 306. In one embodiment, a multi-weight synapse 304 may include a plurality of single-bit storage cells, such as SRAM cells, SLC Flash cells, or the like, which each store one bit, either a 1 or a 0. In another embodiment, however, a multi-weight synapse 304 may include one or more multi-state memory cells. Although even a single-bit cell provides two states, corresponding to a 1 or a 0, the term "multi-state" cell is used herein to refer to a cell that provides more than two states, and that stores more than one bit per cell. For example, a multi-state cell may provide four states for storing two bits, eight states for storing three bits, sixteen states for storing four bits, or the like. For the same precision, a synapse array 400 that stores two bits per cell may be half the size or area of a synapse array 400 that stores one bit per cell.

In various embodiments, feed-forward classification for an artificial neural network involves reading and applying synaptic weights, and is facilitated by synapses 304 that can be read quickly, with low read energy, and with low read disturbance (e.g., without changing weights stored by other synapses 304). In further embodiments, back-propagated learning for an artificial neural network involves changing synaptic weights, and is facilitated by synapses 304 that provide fast write operations with low write energy, and with high endurance. MRAM memory cells based on magnetic tunnel junctions may provide fast, low-energy read and write operations, with high retention, high endurance, and low read disturbance. However, a synapse array 400 of two-state (parallel and antiparallel) magnetic tunnel junctions may use multiple cells to represent a multi-weight synapse 304, and may be large compared to an array of multi-state cells. Instead, in certain embodiments, a synapse array 400 may include multi-state magnetic memory cells (e.g., MTJs), as described with reference to subsequent Figures, as synapses 304, to provide the same precision as an array of two-state cells, with less area. In certain embodiments, multi-state MTJs may provide higher endurance than certain other types of multi-state resistive memory cells.

Figure 5:
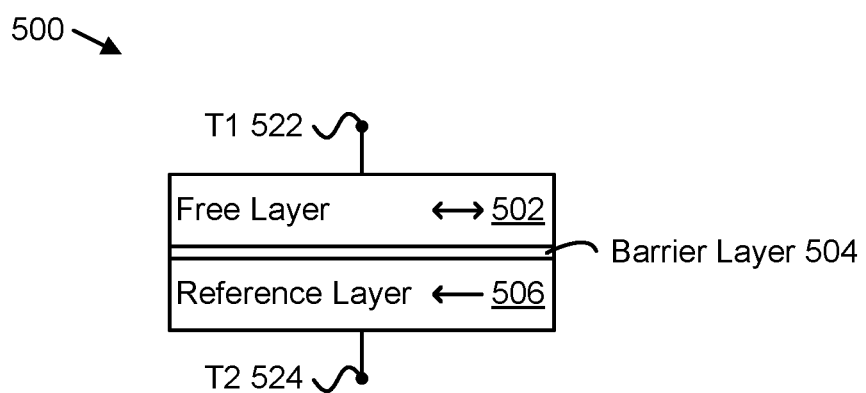
FIG. 5 is a schematic block diagram illustrating one embodiment of a magnetic tunnel junction.

FIG. 5 depicts one embodiment of a magnetic tunnel junction 500. The MTJ 500, in certain embodiments, may be a magnetic memory cell, or may be part of a magnetic memory cell. A memory cell, in various embodiments, may be the smallest data-storing structure of a memory or storage medium or array, such as the MRAM array 200 or the synapse array 400, and may have a physical or electrical property that is configured to be modified, to store data. A range of possible values for the data-storing physical property may be divided into states, corresponding to data values. In further embodiments, a magnetic memory cell may be a memory cell that uses a magnetic physical property, such as a magnetic moment, a magnetization, or the like, to store data. In certain embodiments, a magnetic memory cell may include an MTJ 500, which may store data based on the magnetization or magnetic moment of a free layer 502 relative to a reference layer 506. In another embodiment, a magnetic memory cell may be a cell other than an MTJ 500, which uses magnetization to store data.

The MTJ 500, in the depicted embodiment, includes a free layer 502, a barrier layer 504, and a reference layer 506. Two terminals 522, 524 are depicted for convenience in discussing current flows. In certain embodiments, an MTJ 500 may include or be coupled to metallic or other conductive terminals 522, 524 for coupling the MTJ 500 to lines of an MRAM array 200. In another embodiment, however, lines of an array 200 may be directly coupled to the MTJ 500.

In various embodiments, layers of the MTJ 500 may be formed or deposited by various techniques such as physical vapor deposition, sputtering, or the like. In certain embodiments, further layers not shown in FIG. 5, such as pinning layers, pinned layers, capping layers, or seed layers, may be included in an MTJ 500, in a memory cell that includes an MTJ 500, or in the process of making an MTJ 500 or memory cell.

An MTJ 500, in the depicted embodiment, includes a fixed or reference layer 506 with a fixed or pinned magnetic moment, indicated by a single-headed arrow. In a further embodiment, an MTJ 500 includes a storage or free layer 502, with a magnetic moment that can be changed or switched, indicated by a double-headed arrow. A thin dielectric or barrier layer 504 may separate the reference layer 506 from the free layer 502, and current may flow across the barrier layer 504 due to quantum tunneling. The probability of an electron tunneling through the barrier layer 504 is higher if the magnetic moments of the reference layer 506 and the free layer 502 are substantially parallel to each other (referred to herein as the parallel state for the MTJ 500), and lower if the magnetic moments of the reference layer 506 and the free layer 502 are substantially antiparallel to each other (referred to herein as the antiparallel state for the MTJ 500). Therefore, an electrical resistance through the MTJ 500 may be higher in the antiparallel state than in the parallel state.

In various embodiments, a difference in resistance between parallel and antiparallel states of an MTJ 500 allows data to be stored. For example, a low resistance may correspond to a binary "1" and a high resistance may correspond to a binary "0," Alternatively, a low resistance may correspond to a binary "0" and a high resistance may correspond to a binary "1."

In certain embodiments, a magnetic storage or free layer 502 may be magnetized as a single domain, which may be magnetized parallel or antiparallel to the reference layer 506, corresponding to a low resistance state and a high resistance state for the MTJ 500. In further embodiments, a storage or free layer 502 may include two or more magnetic domains, with one or more domain walls between domains in the free layer 502, so that at least one domain is magnetized parallel to the reference layer 506 and at least one domain is magnetized antiparallel to the reference layer 506. In certain embodiments, a controller such as a die controller 206 may apply a write current that forms, moves, or removes a domain wall from the free layer 502. A resistance through the MTJ 500 when the free layer 502 includes multiple domains may correspond to a ratio between parallel-magnetized volume of the free layer 502 and antiparallel-magnetized volume of the free layer 502. Thus, a partially parallel and partially antiparallel free layer 502 may provide one or more intermediate resistance states for an MTJ 500, between a low resistance state and a high resistance state. For example, in one embodiment, four resistance states may correspond (in order from highest to lowest resistance) to antiparallel, mostly antiparallel, mostly parallel, and parallel states for the free layer 502. An MTJ 500 that provides intermediate resistance states may store or encode more than one bit. For example, an MTJ 500 that provides four states (e.g., two intermediate states between high and low resistance states) may encode two bits, so that the binary values 00, 01, 10, and 11 each correspond to one of the four states.

The fixed or reference layer 506, in one embodiment, includes a ferromagnetic material with a fixed or pinned magnetic moment. As used herein, the term "ferromagnetic" may be used to refer to any material capable of spontaneous magnetization (e.g., remaining magnetized in the absence of an externally applied magnetic field). Thus, a "ferromagnetic" material may refer to a strictly ferromagnetic material (e.g., for which individual microscopic magnetic moments are fully aligned), or to a ferrimagnetic material (e.g., for which individual microscopic magnetic moments are partially anti-aligned).

In various embodiments, a "fixed" or "pinned" magnetic moment refers to a magnetic moment that is substantially constant, at least in orientation, when the magnetic moment of the free layer 502 is changed. Thus, for example, in one embodiment, a reference layer 506 may comprise a ferromagnetic material with a higher coercivity than a ferromagnetic material of a free layer 502. In such an embodiment, an external magnetic field may change the magnetization of both the reference layer 506 and the free layer 502, but with a larger effect on the free layer 502. In another embodiment, a reference layer 506 may comprise a ferromagnetic thin film with a magnetic moment pinned by exchange coupling with an antiferromagnet. For example, in one embodiment, a reference layer 506 may include a synthetic antiferromagnet (e.g., a cobalt/iron and ruthenium multilayer), a ruthenium or iridium spacer, and a ferromagnetic layer comprising a cobalt/iron/boron alloy (CoFeB).

The magnetic moment of the reference layer 506, in various embodiments, may provide a reference for the orientation of one or more magnetic moments of the free layer 502. For example, in various embodiments, one or more magnetic moments for domains of the free layer 502 may be parallel or antiparallel to the magnetic moment of the reference layer 506. Thus, the reference layer 506 is depicted with a reference magnetic moment indicated by a single-headed arrow, and the parallel or antiparallel magnetic moment(s) of the free layer 502 are indicated by a double-headed arrow.

In the depicted embodiment, the magnetic moments of the reference layer 506 and the free layer 502 are in-plane magnetic moments. In another embodiment, however, the magnetic moments of the reference layer 506 and the free layer 502 are in-plane magnetic moments. As used herein, terms such as "in-plane" and "perpendicular" may be used to describe a direction or orientation (e.g., for a vector quantity such as a magnetic moment, magnetization, current density, or the like), relative to a layer of an MTJ 500. In one embodiment, the term "perpendicular" refers to a direction at right angles to a surface of a layer (e.g., vertically in FIG. 5), and the term "in-plane" refers to a direction parallel to a surface of the layer (e.g., horizontally in FIG. 5). In another embodiment, however, a vector, orientation, or direction may include a combination of perpendicular and in-plane components, and but may be described as either "perpendicular" or "in-plane" based on whether the perpendicular component or the in-plane component has a greater magnitude. For example, in one embodiment, where a magnetic moment includes non-zero in-plane and perpendicular components, it may nevertheless be described as an "in-plane" magnetic moment if the in-plane component is greater than the perpendicular component.

For example, in the depicted embodiment, with in-plane magnetic moments, a magnetic moment for the reference layer 506 may point toward the left of FIG. 5, so that a parallel magnetic moment for a domain of the free layer 502 points toward the left of FIG. 5, and an antiparallel magnetic moment for a domain of the free layer 502 points toward the right of FIG. 5. In another embodiment, with magnetic moments perpendicular to the layers, a magnetic moment for the reference layer 506 may point toward the top of FIG. 5, so that a parallel magnetic moment for a domain of the free layer 502 points toward the top of FIG. 5, and an antiparallel magnetic moment for a domain of the free layer 502 points toward the bottom of FIG. 5.

The barrier layer 504, in various embodiments, is disposed between the fixed or reference layer 506 and the free layer 502. In certain embodiments, the barrier layer 504 comprises a dielectric material, such as magnesium oxide (MgO). In certain embodiments, the barrier layer 504 may be less than 20 angstroms thick, so that quantum tunneling of electrons across the barrier layer 504 allows current to flow through the MTJ 500.

In general, in various embodiments, the free layer 502 may comprise a ferromagnetic material, for which the magnetic moment of the free layer 502 as a single domain, or the magnetic moments of one or more magnetic domains within the free layer 502, can be changed, switched, or flipped, relative to the magnetic moment of the reference layer 506. Changing the magnetic moment(s) of the free layer 502 changes the electrical resistance of the MTJ 500, allowing data to be stored. In certain embodiments, a ferromagnetic material of the free layer 502 may include a CoFeB alloy. In some embodiments, the free layer 502 may include multi-layers based on transition metals like cobalt and iron, and noble metals such as platinum, palladium, and gold. Some examples include cobalt/palladium, cobalt/platinum and cobalt/nickel.

Reading data from an MTJ 500, in various embodiments, may include measuring, detecting, or sensing a resistance of the MTJ 500 (e.g., indicating whether the MTJ 500 is in a parallel, antiparallel, or intermediate state). For example, in one embodiment, a known voltage may be applied across a first terminal T1 522 and a second terminal T2 524, and the resulting current through the free layer 502, the barrier layer 504, and the reference layer 506 may be measured or sensed to detect the resistance of the MTJ 500. In another embodiment, a known current may be applied through the free layer 502, the barrier layer 504, and the reference layer 506, and the resulting voltage drop between the first terminal T1 522 and the second terminal T2 524 may be measured or sensed to detect the resistance. In certain embodiments, an MRAM array 200, MRAM die 150, neuromorphic computing die 450, or the like may include sense amplifiers, latches, and the like, to convert a low power signal to a logic level representing a data value, and to store the converted data.

Writing data to an MTJ 500, in various embodiments, may include setting or changing magnetization in the free layer 502 so that the MTJ 500 is in the desired parallel, intermediate, antiparallel state. Various types of MRAM provide various ways to set the magnetic moment of the free layer 502. In spin-transfer torque (STT) MRAM, data may be written by passing a spin-polarized electrical current through an MTJ 500 (e.g., between the first terminal T1 522 and the second terminal T2 524), to change magnetization in the free layer 502. By contrast, in spin-orbit torque (SOT) MRAM, data may be written by applying an electrical current through a spin Hall effect material adjacent to the free layer 502 (e.g., from a first write terminal T1 522, parallel to the free layer 502, to a second write terminal, not shown in FIG. 5), thus generating a pure spin current for changing magnetization in the free layer 502. In another embodiment, data may be written by applying a magnetic field to the free layer 502, and so that the applied field exerts a torque on magnetic moment(s) of the free layer 502. For example, in one embodiment, data may be written by applying an electrical current through one or more write wires or write lines near or adjacent to the free layer 502, so that the current produces a magnetic field around the write lines in accordance with Ampere's law.

In various embodiments, a controller, such as the die controller 206, may supply an electrical write current for writing data to the MTJ 500. In one embodiment, the write current may control a magnetic field applied to the free layer 502. In another embodiment, the write current may control a spin current injected into the free layer 502, either in the form of a spin-polarized electrical current for STT MRAM, or in the form of a pure spin current for SOT MRAM. For example, in one embodiment, the magnitude of the applied magnetic field, or of the injected spin current, may be proportional to the write current, or may increase with the write current. In a certain embodiment, increasing the write current may increase the applied magnetic field, or the injected spin current. Thus, in one embodiment, a controller may use different write currents to program an MTJ 500 to different resistance states. In another embodiment, reversing the write current may reverse the direction of the applied magnetic field, or the injected spin current. Thus, in one embodiment, a controller may apply write currents in different directions to increase or decrease the resistance of the MTJ 500.

Thus, in one embodiment, a die controller 206 for a memory array such as the MRAM array 200 may write or modify data by controlling write currents for memory cells or MTJs 500 in the array 200 via the row circuits 202 and the column circuits 204. Similarly, in another embodiment, a die controller 206 for a synapse array 400 may modify synapse weights for the synapse array 400 by controlling write currents for multi-state magnetic memory cells (e.g., MTJs 500) of the array via the row/axon circuits 402 and the column/dendrite circuits 404.

A controller may include or communicate with power generating components such as current sources, voltage sources, level shifters or the like, switching components such as transistors for coupling currents to MTJs 500, sensing components such as sense amplifiers, latches to store sense amplifier outputs, and the like.

FIG. 6A through FIG. 8 depict top views of various embodiments of free layers 600, 700, 800, for a magnetic tunnel junction 500 or multi-state magnetic memory cell. The free layers 600, 700, 800, in certain embodiments, may be substantially similar to the free layer 502 described above with reference to FIG. 5. For convenience in depicting the shape, outline, or configurations of the free layers 600, 700, 800, further layers of an MTJ 500 such as a barrier layer 504 or a reference layer 506 are not shown in FIGS. 6A through FIG. 8.

In various embodiments, a shaped free layer that provides multiple resistance states for an MTJ 500, such as the free layer 600 of FIGS. 6A-6D, the free layer 700 of FIGS.

Figure 8:
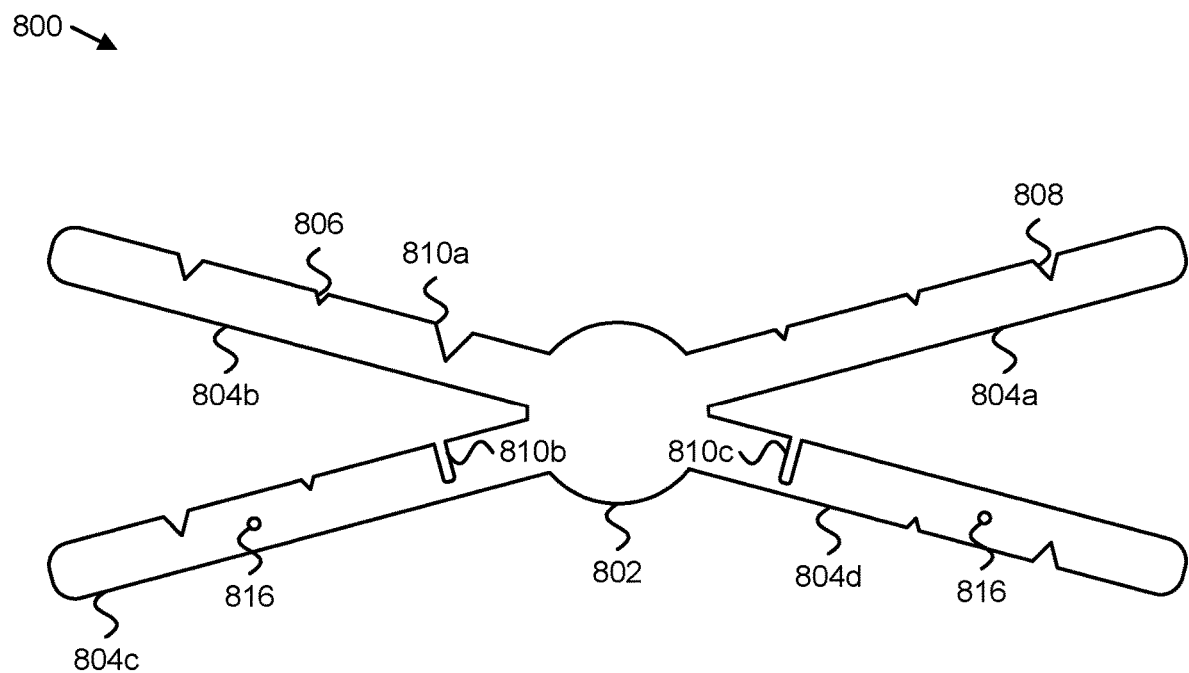
FIG. 8 is a top view illustrating another embodiment of a free layer for a magnetic tunnel junction.

7A-7H, or the free layer 800 of FIG. 8, may be formed by various techniques such as physical vapor deposition, sputtering, and may be shaped by using lithography to control where ferromagnetic material is deposited, using e-beam milling to control where ferromagnetic material is removed, or the like. In one embodiment, layers such as a barrier layer 504 or a reference layer 506 may be shaped to match a free layer 600, 700, 800. For example, material addition and removal processes may be similar for the fixed or reference layer 506, the barrier layer 504 and the free layer 600, 700, 800, so that the reference layer 506, the barrier layer 504 and the free layer 600, 700, 800 are similarly shaped. In another embodiment, layers such as a barrier layer 504 or a reference layer 506 may be shaped to extend beneath (or above) the free layer 600, 700, 800, but may also extend beyond the edges of the free layer 600, 700, 800. For example, material addition processes may be similar for the fixed or reference layer 506, the barrier layer 504 and the free layer 600, 700, 800, but material removal processes may be carried out only for the free layer 600, 700, 800, so that the barrier layer 504 and the reference layer 506 occupy more area than the free layer 600, 700, 800. As another example, lithographic masks may be simpler for the reference layer 506 and the barrier layer 504 than for the free layer 600, 700, 800 so that a rectangular, oval or other simply-shaped reference layer 506 and barrier layer 504 extend beneath a free layer 600, 700, 800 with a more complicated shape. In an array 200, 400, the space between cells, and space where ferromagnetic material is removed (or omitted) from the free layer 600, 700, 800 may be left empty, may be filled with a non-ferromagnetic dielectric material to provide structural support for the cells while avoiding short circuits between cells, or the like.

In FIGS. 6A-7H, arrows represent the magnetization of the free layers 600, 700, or of domains within the free layers 600, 700. Additionally, in FIGS. 6A-7H, the magnetization of the fixed or reference layer 506 is to the right of the Figure, so that a left-pointing arrow represents an antiparallel state for a free layer 600, 700, or for a domain within the free layers 600, 700, and so that a right-pointing arrow represents a parallel state for a free layer 600, 700, or for a domain within the free layers 600, 700. However, the depicted and described magnetizations are for exemplary purposes, and are not intended as limiting. For example, a magnetization for a reference layer 506 may be in another in-plane or perpendicular direction, with corresponding parallel and antiparallel directions in free layers 600, 700.

FIGS. 6A-6D depict different resistance states for a free layer 600 of a magnetic tunnel junction 500 or multi-state magnetic memory cell, in one embodiment. In the depicted embodiment, the free layer 600 includes a nucleation region 602, a wall extension region 604, and a plurality of pinning sites 606, 608. FIGS. 6A through 6D depict resistance states in descending order from a high resistance state in FIG. 6A to a lower resistance state in FIG. 6D.

In certain embodiments, the free layer 600 may provide a plurality of resistance states for an MTJ 500: a high resistance state, where the free layer 600 is magnetized antiparallel to the reference layer 506; a low resistance state, where the free layer 600 is magnetized parallel to the reference layer 506; and a plurality of intermediate resistance states where the free layer 600 includes at least one magnetic domain magnetized parallel to the reference layer 506, at least one magnetic domain magnetized antiparallel to the reference layer 506, and at least one domain wall 650 separating parallel and antiparallel domains. In a further embodiment, the plurality of intermediate resistance states may correspond to positions of the domain wall 650 within the free layer 600 (e.g., within the wall extension region 604). In certain embodiments, if a free layer 600 is in a fully parallel or fully antiparallel state, without a domain wall 650, a write current or erase current from a controller may cause a magnetic domain to form or nucleate in the nucleation region 602. As the write or erase current continues, or increases, a domain wall 650 for the newly-formed domain may migrate as the domain expands to saturate the nucleation region 602, leaving a domain wall 650 in the wall extension region 604. A first pinning site 606 may pin the domain wall 650 at a predetermined location in the free layer 600, providing a consistent intermediate resistance state. Additional energy (e.g., from an increased write current) may unpin the domain wall 650 from a first pinning site 606, and move the domain wall 650 to a second pinning site 608, corresponding to a second intermediate resistance state.

Figure 6A:
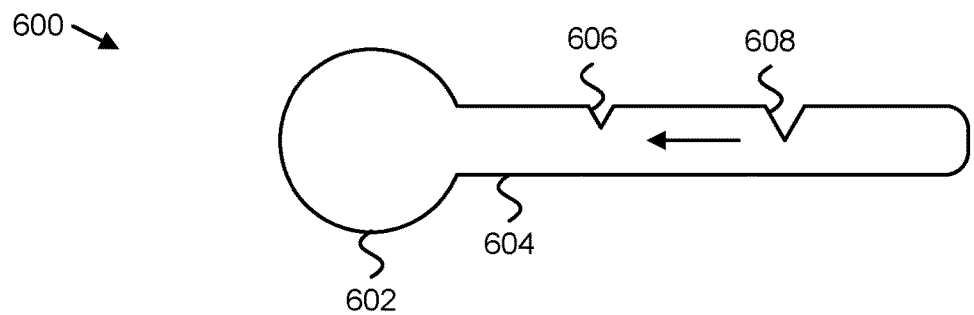
FIG. 6A is a top view illustrating one embodiment of a free layer for a magnetic tunnel junction, in a first resistance state.

In FIG. 6A, the free layer 600 is magnetized as a single domain, antiparallel to the magnetic moment of the reference layer 506. A domain, or magnetic domain, in various embodiments, may be a region of uniform or substantially uniform magnetization for a magnetic material. Within a domain, individual microscopic magnetic moments may be aligned for strictly ferromagnetic materials, or partially anti-aligned for ferrimagnetic materials, resulting in a net magnetic moment for the domain. A domain wall 650 (present in FIGS. 6B and 6C but not in FIG. 6A or 6D), in various embodiments, may be a boundary region between different domains of a magnetic material. Individual microscopic magnetic moments may transition across a domain wall 650, from being aligned with a magnetic moment for a first domain, to being aligned with a magnetic moment for a second domain on the opposite side of the domain wall 650. Within the domain wall 650, between domains with two different magnetic moments, individual microscopic magnetic moments may be aligned with neither magnetic moment, but may point in intermediate directions between the first magnetic moment and the second magnetic moment. Various types of domains, and domain walls 650, such as Bloch walls, Néel walls, and hybrid walls, will be clear in view of this disclosure.

Terms such as "parallel" and "antiparallel" may be used herein to refer to an orientation for the magnetic moment or magnetization of the free layer 600, 700, 800, or of a domain within the free layer 600, 700, 800, relative to the magnetic moment or magnetization of the reference layer 506. Thus, a "parallel" magnetic moment or magnetization for a domain, or for the free layer 600, 700, 800, refers to a magnetic moment or magnetization parallel to the magnetic moment of the reference layer 506, even if the magnetic moment of the reference layer 506 is not explicitly referred to. Similarly, the free layer 600, 700, 800, or a domain within the free layer 600, 700, 800 may be referred to as "parallel" or "antiparallel" based on a corresponding parallel or antiparallel magnetization, without explicit reference to the magnetic moment of the reference layer 506.

In FIG. 6A, the single-domain free layer 600 has an antiparallel magnetic moment, corresponding to a high resistance state for the MTJ 500. In certain embodiments, a write current from a controller, such as the die controller 206, may control a magnetic field applied to the free layer 600, or a spin current injected into the free layer 600, and a new domain, and domain wall 650, may form in the nucleation region 602 in response to the write current.

The nucleation region 602, in certain embodiments, may be a region of the free layer 600 that is configured to form a domain wall 650, or to facilitate formation of a domain wall 650. In certain embodiments, the nucleation region 602 may be larger, in at least one dimension, than a wall extension region 604. For example, in the depicted embodiment, the wall extension region 604 is an elongate arm or track, and the nucleation region 602 is a circular region with a diameter approximately three times the width of the elongate arm. In certain embodiments, the increased dimension of the nucleation region 602, relative to a dimension of the wall extension region 604 may facilitate formation of a domain wall 650 in the nucleation region 602 rather than in the wall extension region 604.

In certain embodiments, the nucleation region 602 may be a pad-shaped region of the free layer 600. An area, such as a region of a free layer 600 may be referred to as "elongate" if a length (or longest dimension) of the region is substantially greater than the width (or shortest dimension) of the region (e.g., five times longer, ten times longer, twenty times longer, or the like), or as "pad-shaped" if a length (or longest dimension) of the region is comparable to the width (or shortest dimension) of the region (e.g., equal to the width, less than double the width, less than triple the width, less than quadruple the width or the like). In certain embodiments, a pad-shaped region may be convex. For example, a pad-shaped region may be a circle, oval, triangle, square, rectangle, rounded rectangle, oblong, pentagon, hexagon, or the like. Various shapes and sizes of pad-shaped regions suitable for use as a nucleation region 602 of a free layer 600 will be clear in view of this disclosure.

The wall extension region 604, in various embodiments, may be a region of the free layer 600 that is configured to provide a plurality of resistance states for the memory cell or MTJ 500, where the resistance states corresponding to positions of a domain wall 650 within the wall extension region 604. In certain embodiments, a wall extension region 604 may be an arm or track extending from the nucleation region 602 (e.g., horizontally, or within the plane of the free layer 600). An arm or track may be an elongate region as described above. When referring to an elongate arm or track, terms such as "long," "along the arm," "length," or the like are used herein to refer to directions towards or away from the nucleation region 602, whereas terms such as "narrow," "across the arm," "width," or the like are used to refer to directions neither towards nor away from the nucleation region 602 (e.g., in the plane of the free layer 600, but at right angles to the length of the arm). In a certain embodiment, an arm or track extending from the nucleation region 602 as a wall extension region 604 may be narrower than the nucleation region 602, thus facilitating domain wall nucleation in the nucleation region 602 rather than in the arm. For example, a width of an arm, relative to size of a nucleation region 602 (in the same cross-arm) direction, may be three fourths the size of a nucleation region 602, two thirds the size of the nucleation region 602, half the size of the nucleation region 602, one third the size of the nucleation region 602, one fourth the size of the nucleation region 602, or the like.

In various embodiments, a domain wall 650 may form in the nucleation region 602 and migrate to a position within the wall extension region 604. In certain embodiments, the resistance of the MTJ 500 may be based on a ratio of volumes for parallel and antiparallel domains of the free layer 600. In a further embodiment, with a domain wall 650 in an elongate wall extension region 604, the parallel to antiparallel volume ratio may substantially correspond to the position of the domain wall 650 along the length of the wall extension region 604, rather than to the shape of the domain wall 650 across the wall extension region 604. Thus, in certain embodiments, an elongate wall extension region 604 may provide a plurality of resistance states for the MTJ 500, corresponding to positions of a domain wall 650 along the wall extension region 604.

In certain embodiments, a free layer 600 may include one or more wall extension regions 604, or arms, extending from a nucleation region 602 or pad-shaped region. Multiple arms or wall extension regions 604 are discussed in further detail below with reference to FIGS. 7A-8.

A plurality of pinning sites 606, 608, in certain embodiments, may be configured to pin the domain wall 650. In a further embodiment, a wall extension region 604 or arm may include a plurality of pinning sites 606, 608 formed at predetermined locations along the wall extension region 604 or arm, for pinning a domain wall 650.

In various embodiments, as an applied field or an injected spin current expands a domain, moving a domain wall 650, the domain wall 650 may be "pinned" at a local energy minimum caused by a non-magnetic inclusion in a ferromagnetic region, a crystallographic defect or irregularity in the volume of a ferromagnetic region, a defect or irregularity at an edge or surface of a ferromagnetic region, or the like. Increasing the applied field or an injected spin current (e.g., by increasing a write current from a controller) may cause the domain wall 650 to "unpin" from one location and jump to a neighboring location. Thus, a domain may grow in sudden steps as a domain wall 650 pins and unpins, rather than growing smoothly. In certain materials, a domain wall 650 may pin to random irregularities or defects in, or at the surface of a ferromagnetic region, such as a free layer 600 for an MTJ 500. A "pinning strength" for a location as used herein, may refer to any measurement, indication, or number corresponding to the difficulty of unpinning the domain wall 650 from a location, such as an amount of energy sufficient to move the domain wall 650, a write current sufficient to move the domain wall 650, a magnitude of an applied field sufficient to move the domain wall 650, or the like.

Although domain walls 650 may pin with low pinning strength to a variety of random inclusions or irregularities, a pinning site 606, 608, in various embodiments, may be a location configured to pin the domain wall 650 with a significantly higher pinning strength than a random surface defect.

For example, a pinning site 606, 608, in certain embodiments, may be an irregularity or discontinuity in an edge, surface, or volume of the free layer 600, which may be intentionally formed to be larger than randomly formed defects, so as to have a greater pinning strength than randomly formed defects. In various embodiments, a pinning site 606, 608, may be any structure intentionally formed in a free layer 600 of an MTJ 500, (e.g., in a wall extension region 604 or arm of the free layer 600) for pinning a domain wall 650. In the depicted embodiment, the pinning sites 606, 608 are v-shaped notches that extend partway across the width of the wall extension region 604. In another embodiment, a pinning site 606, 608 may be an indentation, a rounded, semicircular, or u-shaped notch, a rectangular notch, an indentation in the height of the wall extension region 604, a hole milled or formed through the wall extension region 604 from top to bottom, a protuberance increasing the width or height of the wall extension region 604 at a particular location, a void or gap decreasing the width or height of the wall extension region 604 at a particular location, or the like. Various ways of forming pinning sites 606, 608 for a free layer 600 will be clear in view of this disclosure.

Locations for pinning sites 606, 608 in a free layer 600 (e.g., along a wall extension region 604 or arm) may be predetermined by a manufacturer of an MTJ 500. A manufacturer may select locations for pinning sites 606, 608, based on one or more factors such as a desired number of resistance states for the MTJ 500, desired ratios or differences between resistances for different states, or the like. Various ways to determine locations for pinning sites 606, 608 will be clear in view of this disclosure.

In certain embodiments, a domain wall 650 may migrate by unpinning from one pinning site 606, and pinning to a subsequent pinning site 608, in response to an increased write current from a controller. In certain embodiments, pinning sites 606, 608 may be configured so that a domain formed in the nucleation region 602 expands in steps, as a domain wall 650 migrates to a first pinning site 606, then to a second pinning site 608, in order. A "subsequent" pinning site, as used herein, may refer to the next pinning site (e.g., pinning site 608) encountered by a migrating domain wall 650 after unpinning from another pinning site (e.g., pinning site 606).

FIGS. 6A through 6D illustrate a free layer 600 at different times or resistance states, from prior to formation of a new domain or domain wall 650, to migration of the domain wall 650 to pinning sites 606, 608 in sequence, to saturation of the free layer 600 by the newly formed domain.

In FIG. 6A, the free layer 600 is a single domain in an antiparallel state, so the MTJ 500 is in a high resistance state. A controller may change a data value stored by the MTJ 500 by forming a parallel-magnetized domain within the free layer 600. A domain, and a corresponding domain wall 650, may form in or at the nucleation region 602 in response to a write current from a controller.

Figure 6B:
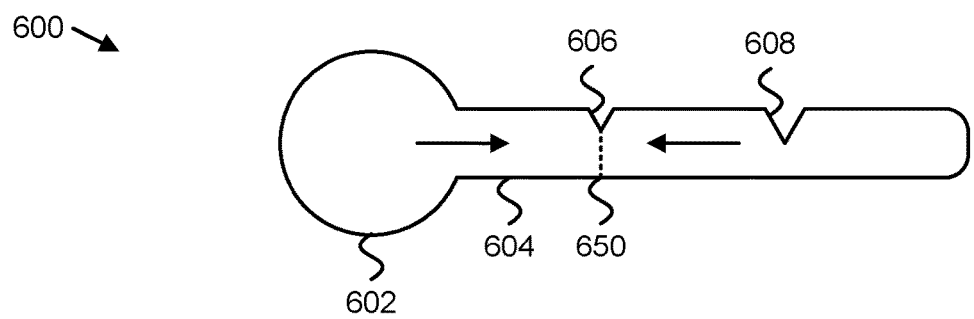
FIG. 6B is a top view illustrating the free layer of FIG. 6A, in a second resistance state.

In FIG. 6B, the newly-formed domain has expanded in response to the write current, saturating the nucleation region 602, and expanding until a domain wall 650 is pinned at the first pinning site 606. Thus, the nucleation region 602 and the wall extension region 604 out to the first pinning site 606 are now magnetized parallel to the reference layer 506. The remainder of the wall extension region 604 remains magnetized antiparallel to the reference layer 506, and the free layer 600 includes two different domains. The volume ratio between the parallel and antiparallel domains determines the resistance of the MTJ 500. Because the fraction of parallel-magnetized volume has increased relative to the high resistance state of FIG. 6A, the resistance of the MTJ 500 has decreased in FIG. 6B.

Figure 6C:
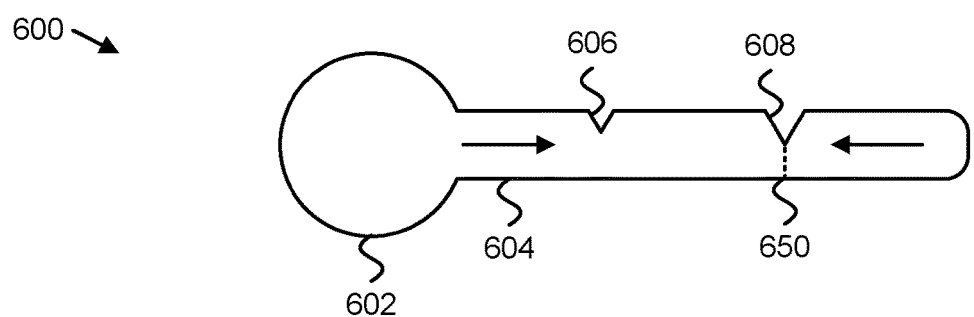
FIG. 6C is a top view illustrating the free layer of FIG. 6A, in a third resistance state.

In FIG. 6C, the parallel-magnetized domain has expanded in response to an increased write current from the controller. The increased write current has unpinned the domain wall 650 from the first pinning site 606, and expanded the parallel-magnetized domain to the second pinning site 608. Thus, the nucleation region 602 and the wall extension region 604 out to the second pinning site 608 are now magnetized parallel to the reference layer 506, and the remainder of the wall extension region 604 beyond the second pinning site 608 remains magnetized antiparallel to the reference layer 506. Because the fraction of parallel-magnetized volume has increased relative to the state depicted in FIG. 6B, the resistance of the MTJ 500 has further decreased in FIG. 6C.

Figure 6D:
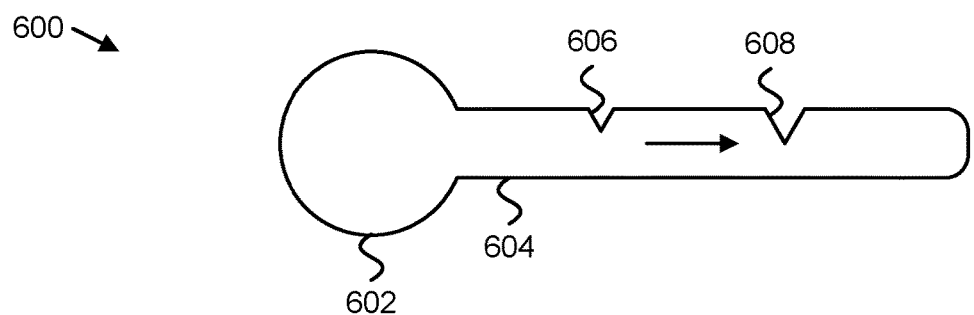
FIG. 6D is a top view illustrating the free layer of FIG. 6A, in a fourth resistance state.

In FIG. 6D, the parallel-magnetized domain has further expanded in response to an increased write current from the controller. The increased write current has unpinned the domain wall 650 from the second pinning site 608, and expanded the parallel-magnetized domain to saturate the wall extension region 604. The free layer 600 is thus a single domain again, without a domain wall 650, fully magnetized parallel to the reference layer 506, and the MTJ 500 is thus in a low resistance state.

In various embodiments, such as the depicted embodiment of FIGS. 6A-6D, a resistance state for an MTJ 500 is based on whether a domain wall 650 exists in the free layer 600, and where the domain wall 650 is pinned. Without a domain wall 650, the free layer 600 is magnetized fully parallel or antiparallel to the reference layer 506, and the MTJ 500 is thus in a low resistance or high resistance state. If multiple domains exist in the free layer 600, separated by a domain wall 650, the free layer 600 is magnetized partially parallel and partially antiparallel to the reference layer 506, and the position where the domain wall 650 is pinned determines the ratio of parallel to antiparallel volumes, and thus determines the resistance for the MTJ 500 in an intermediate resistance state between the high and low resistance states.

In a certain embodiment, the MTJ 500 may be configured to provide four or more possible resistance states. For example, the free layer 600 depicted in FIGS. 6A-6D provides four different resistance states. In another embodiment, a free layer 600 may include additional wall extension regions 604 extending from the nucleation region 602, and/or additional pinning sites 606, 608, and thus may provide more than four resistance states corresponding to different volume fractions for parallel versus antiparallel domains. For example, a newly-formed domain may saturate a central nucleation region 602, and expand into multiple wall extension regions 604, forming multiple domain walls 650, and additional resistance states may correspond to positions of a second domain wall 650 within a second wall extension region 604.

FIGS. 7A-7H depict another embodiment of a free layer 700 for a magnetic tunnel junction 500, in a top view. In the depicted embodiment, the free layer 700 includes a pad-shaped region 702, two arms 704, and a plurality of pinning sites 706, 708, 710 formed in the arms 704.

The pad-shaped region 702, in various embodiments, may be substantially similar to the nucleation region 602 described above with reference to FIGS. 6A-6D, and may be configured to facilitate formation of a magnetic domain wall 750 in response to a write current. The arms 704 and pinning sites 706, 708, 710 in various embodiments, may be substantially similar to the wall extension region 604 and pinning sites 606, 608 described above with reference to FIGS. 6A-6D. A domain wall 750 may also be substantially similar to the domain wall 650 described above with reference to FIGS. 6A-6D.

In the depicted embodiment, the pinning sites 706, 708, 710 are notches, and a notch depth, or a distance that the notch extends across an arm 704 determines the pinning strength of the notches. In various embodiments, deeper notches may have a greater pinning strength than shallower notches.

In one embodiment, the pad-shaped region 702 may be a dot or disk, central to the free layer 700, and approximately 300 nanometers (nm) in diameter. For example, in one embodiment, the central dot or pad-shaped region 702 may have a diameter in a range from 200 nm to 400 nm. In a further embodiment, the central dot or pad-shaped region 702 may have a diameter in a range from 250 nm to 350 nm. In a certain embodiment, the central dot or pad-shaped region 702 may have a diameter in a range from 290 nm to 310 nm.

The arms 704, in a certain embodiment, may be approximately 1000 nm long (e.g., in a range from 900 nm to 1100 nm, in a range from 950 nm to 1050 nm, or the like), and may be approximately 100 nm wide (e.g., in a range from 80 nm to 120 nm, in a range from 90 nm to 110 nm, in a range from 95 nm to 105 nm, or the like). In various embodiments, notches for pinning sites 706, 708, 710, may have notch depths of approximately 20 nm, approximately 40 nm, approximately 60 nm, or the like. In another embodiment, a free layer 700 may be scaled up or down proportionally, so that an arm length is approximately ten times an arm width, a central dot or pad-shaped region 702 diameter is approximately three times the arm width, and a notch depth is approximately 20%, 40%, or 60% of the arm width. Various possible sizes for a pad-shaped region 702 or central dot, arms 704, and notches for pinning sites 706, 708, 710 will be clear in view of this disclosure.

In certain embodiments, a first arm 704a includes one or more intermediate pinning sites 706, of a first pinning strength, and a terminal pinning site 708 of a second pinning strength greater than the first pinning strength. Terms such as "intermediate," and "terminal" may be used herein with reference to pinning sites 706, 708, referring to a distance of the pinning site 706, 708 along the arm 704 from the pad-shaped region 702 (or from a similar nucleation region 602). Thus, a "terminal" pinning site 708 is a pinning site in an arm 704 furthest from the nucleation or pad-shaped region 702, and "intermediate" pinning sites 706 are disposed at intermediate positions along the arm 704 between the nucleation or pad-shaped region 702 and a terminal pinning site 708. In certain arms 704, such as a second arm 704b, an "initial" pinning site 710 may further refer to a pinning site 710 of an arm 704 that is closest to the nucleation or pad-shaped region 702, but that is configured differently from the intermediate pinning sites 706.

In certain embodiments, configuring a first arm 704a with a terminal pinning site 708 with a greater pinning strength than the intermediate pinning site(s) 706 may prevent a domain wall 750a from forming at, or depinning from, the end of the first arm 704a, while moving a domain wall 750b in a second arm 704b. Similarly, in the second arm 704b, an initial "arm selection" pinning site 710 may be configured to have a third pinning strength greater than the second pinning strength (for the terminal pinning sites 708) or the first pinning strength (for the intermediate pinning sites 706). An "arm selection" pinning site 710 may be an initial pinning site 710 for an arm 704, with a greater pinning strength (e.g., a greater notch depth) than the pinning sites of another arm 704, so that increasing the write current magnetically saturates one arm 704 before unpinning a domain wall 750 from the initial arm selection pinning site 710 in another arm 704. A second arm 704b, with an initial arm selection pinning site 710, may further include one or more intermediate pinning sites 706 of the first pinning strength, and a terminal pinning site 708 of the second pinning strength, as in the first arm 704a.

In another embodiment, a free layer 700 may include further arms 704 extending from the nucleation or pad-shaped region 702. Further arms 704 may include one or more intermediate pinning sites 706 of the first pinning strength, and a terminal pinning site 708 of the second pinning strength, as in the first arm 704a, and may include initial arm selection pinning sites 710 of increasing pinning strengths relative to the third pinning strength (for the initial arm selection pinning sites 710 in the second arm 704b). Thus, a controller may saturate a first arm 704a before unpinning a domain wall 750b in the second arm 704b, may saturate the second arm 704b before unpinning a domain wall 750 in a third arm 704, and so on.

In a certain embodiment, the intermediate pinning sites 706 may be notches with a notch depth that extends across approximately 20% of the width of an arm 704 (e.g., a depth of 15 nm to 25 nm for a 100 nm arm width). In a further embodiment, the terminal pinning sites 708 may be notches with a notch depth that extends across approximately 40% of the width of an arm 704 (e.g., a depth of 35 nm to 45 nm for a 100 nm arm width). In one embodiment, an initial arm selection pinning site 710 for a second arm 704b may be a notch with a notch depth that extends across approximately 60% of the width of an arm 704 (e.g., a depth of 55 nm to 65 nm for a 100 nm arm width). A notch depth for an initial arm selection pinning site 710 may be deeper than a maximum notch depth in another arm 704, thus providing an initial arm selection pinning site 710 with a greater pinning strength than pinning sites 706, 708 in another arm 704. Various configurations of notch depths, or other shapes of pinning sites 706, 708, 710 configured to provide different pinning strengths, will be clear in view of this disclosure.

Figure 7A:
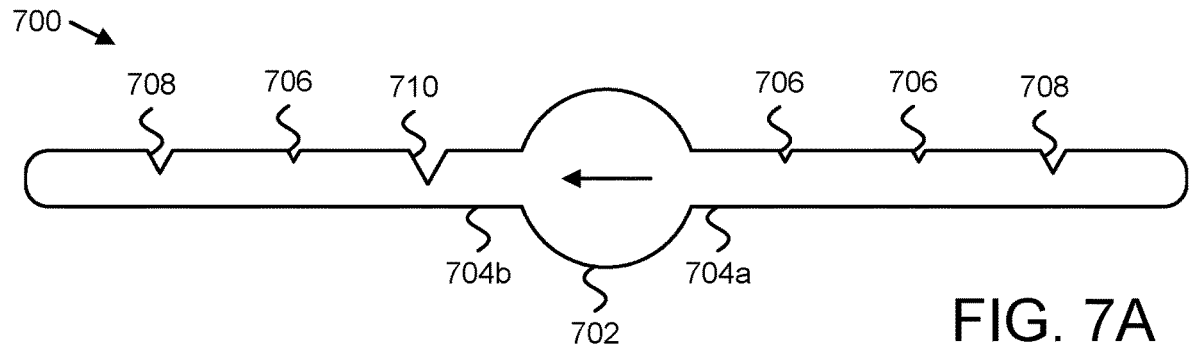
FIG. 7A is a top view illustrating another embodiment of a free layer for a magnetic tunnel junction, in a first resistance state.
Figure 7B:
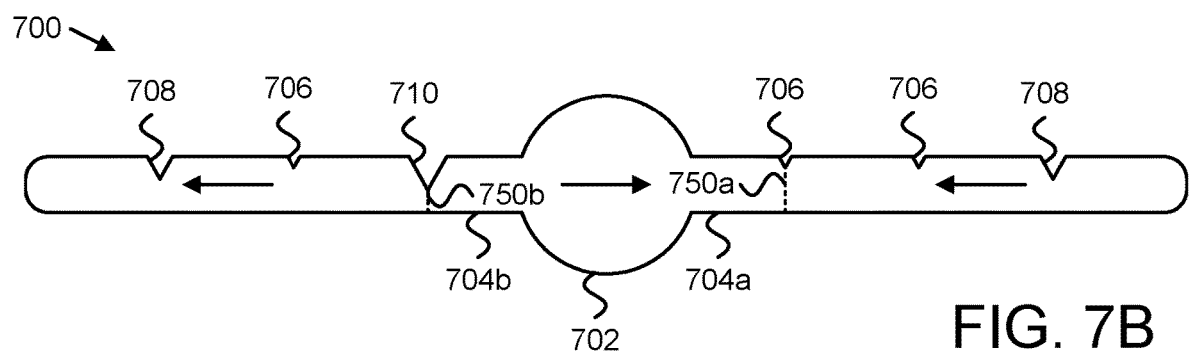
FIG. 7B is a top view illustrating the free layer of FIG. 7A, in a second resistance state.

FIGS. 7A-7H depict resistance states for an eight-state MTJ 500, in order from highest resistance to lowest, as domain walls 750 are formed and moved by application of a write current. In FIG. 7A, the free layer 700 is a single domain, magnetized antiparallel to the reference layer 506, and the MTJ 500 is therefore in its highest resistance state. In FIG. 7B, the controller has applied a write current, forming a parallel-magnetized domain in the pad-shaped region 702, and expanding the new domain to saturate the pad-shaped region 702, until a first domain wall 750a is pinned at a pinning site 706 in the first arm 704a, and a second domain wall 750b is pinned at an initial arm selection pinning site 710 in the second arm 704b. The formation and expansion of the parallel-magnetized domain lowers the resistance of the MTJ 500 to an intermediate state.

Figure 7C:
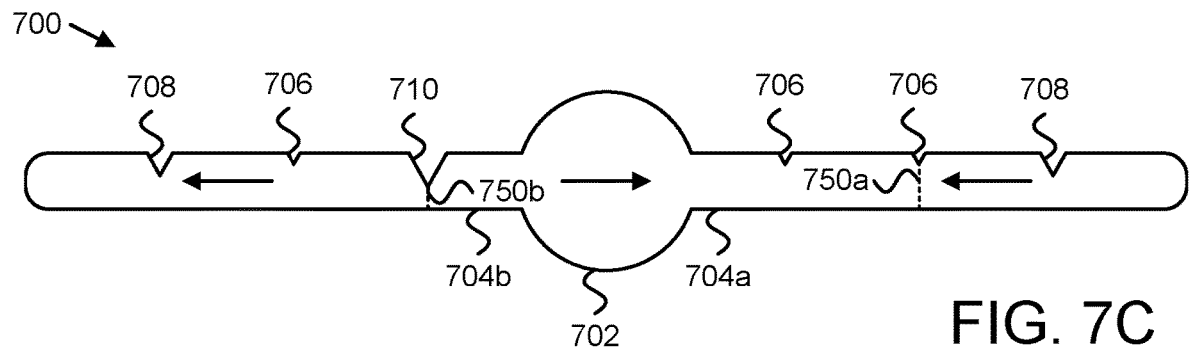
FIG. 7C is a top view illustrating the free layer of FIG. 7A, in a third resistance state.
Figure 7D:
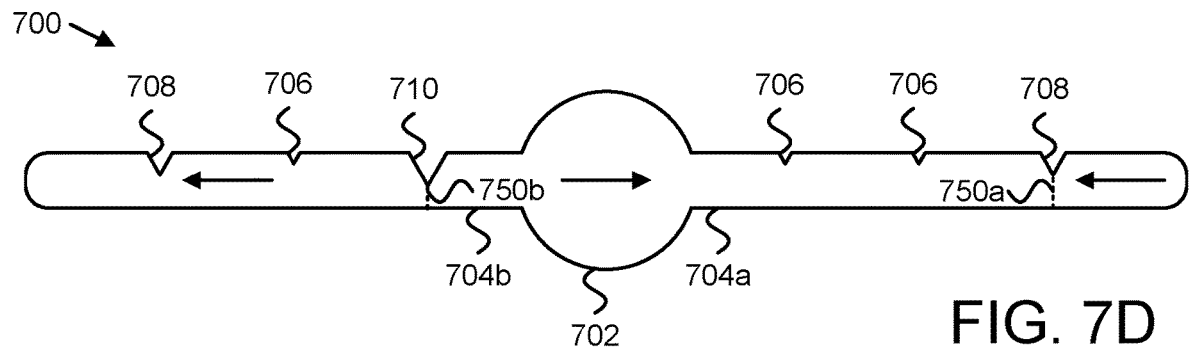
FIG. 7D is a top view illustrating the free layer of FIG. 7A, in a fourth resistance state.
Figure 7E:
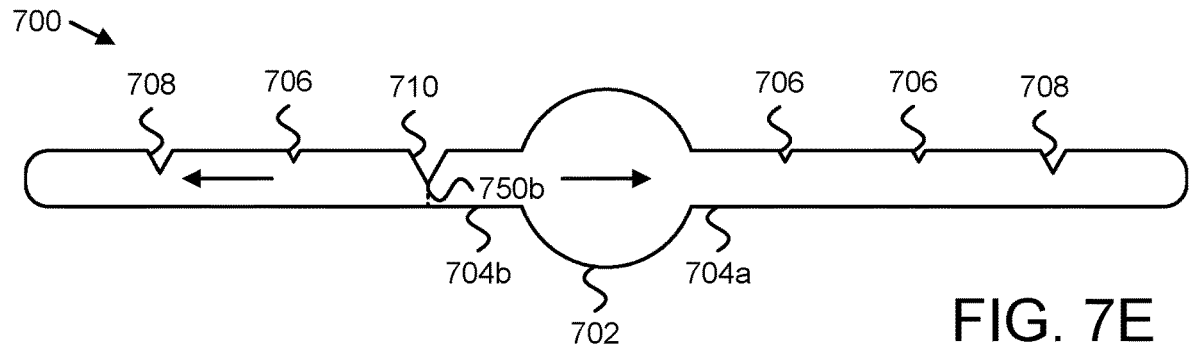
FIG. 7E is a top view illustrating the free layer of FIG. 7A, in a fifth resistance state.

In FIGS. 7B, 7C, and 7D, the controller has applied increased write currents, causing the domain wall 750a in the first arm 704a to unpin from pinning sites 706, 708, and to move to successive pinning sites 706, 708. Thus, the parallel-magnetized domain expands in steps, corresponding to further intermediate resistance states for the MTJ 500. In FIG. 7E, a further increase to the write current has unpinned the domain wall 750a from the terminal pinning site 708 in the first arm 704a, and expanded the parallel-magnetized domain to saturate the first arm 704a, resulting in a further decrease in resistance for the MTJ 500.

Figure 7F:
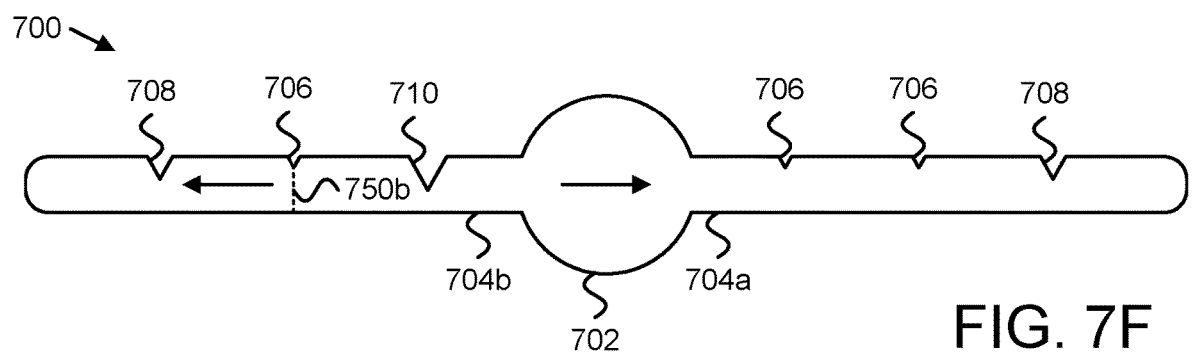
FIG. 7F is a top view illustrating the free layer of FIG. 7A, in a sixth resistance state.
Figure 7G:
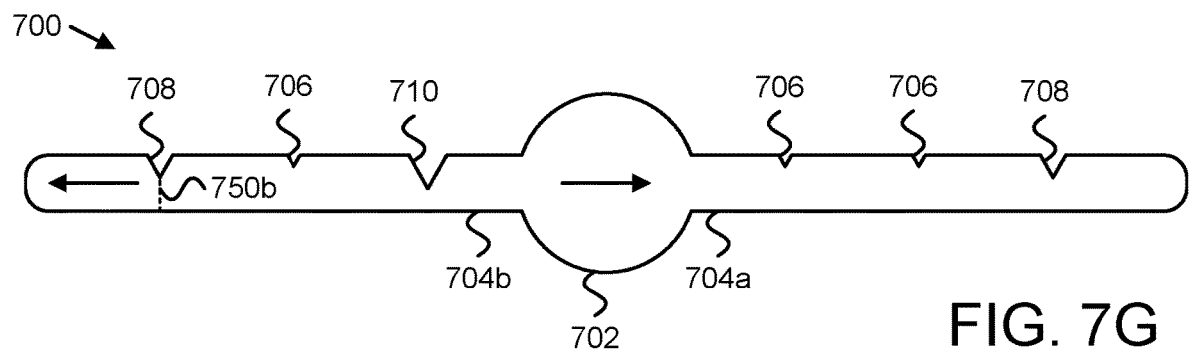
FIG. 7G is a top view illustrating the free layer of FIG. 7A, in a seventh resistance state.
Figure 7H:
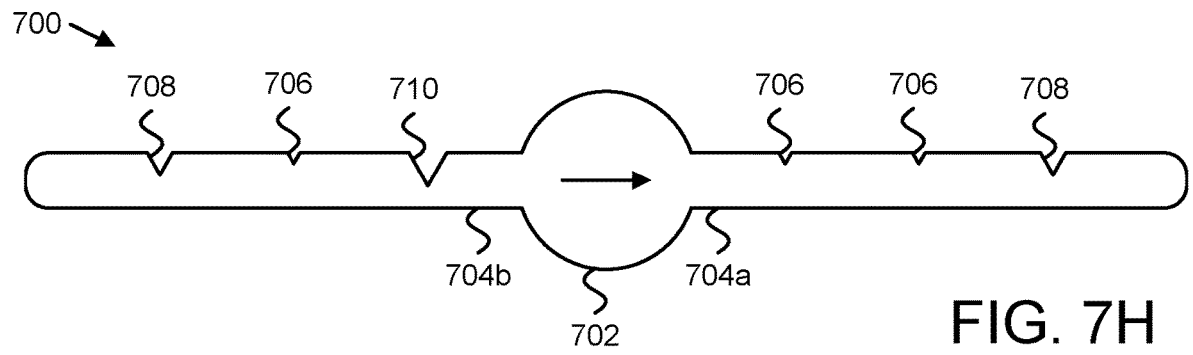
FIG. 7H is a top view illustrating the free layer of FIG. 7A, in an eighth resistance state.

In FIG. 7F, with the first arm 704a saturated, a further increase to the write current causes the domain wall 750b in the second arm 704b, which has been pinned at the initial arm selection pinning site 710 since the parallel-magnetized domain first expanded into the second arm 704b, to unpin from the initial arm selection pinning site 710, and to migrate to an intermediate pinning site 706. In FIGS. 7G and 7H, further increases in the write current unpin the domain wall 750b from pinning sites 706, 708, and expand the parallel-magnetized domain further along the second arm 704b, to repin the domain wall 750b at subsequent pinning sites 708 or to saturate the second arm 704b. Thus, the parallel-magnetized domain is further expanded, resulting in further decreases in resistance for the MTJ 500, until the MTJ 500 reaches its lowest resistance state in FIG. 7H.

In certain embodiments, a write current in the opposite direction, or an erase current, may be applied to form an antiparallel domain and may be increased to saturate the arms 704 (through successive unpinning and repinning), restoring the MTJ 500 to a highest-resistance or antiparallel state. In another embodiment, an MTJ 500 may be erased to a parallel state, and programmed to successively higher resistance states by formation and expansion of an antiparallel domain. In a certain embodiment, an MTJ 500 may be rewritten without erasing, by applying a reversed write current to move an existing domain wall 750 toward, rather than away from, the nucleation or pad-shaped region 702.

In various embodiments, a number of states for a multi-state magnetic memory cell or MTJ 500 is based on a number of notches or pinning sites 706, 708, 710 for the one or more arms 704. In the depicted embodiment, the two arms 704 and the depicted notches or pinning sites 706, 708, 710 provide eight states, allowing the MTJ 500 to store three bits of data. In a further embodiment, increasing the number of arms 704 or the number of notches or pinning sites 706, 708, 710 for the free layer 700 would increase the number of resistance states for the MTJ 500.

FIG. 8 depicts another embodiment of a free layer 800 for a magnetic tunnel junction 500, in a top view. In the depicted embodiment, the free layer 800 includes a nucleation region 802, arms 804, and pinning sites 806, 808, 810, 816, which may be substantially as described above. FIG. 8 illustrates a variety of embodiments of pinning sites 806, 808, 810, 816, including v-shaped notches, u-shaped notches (in either edge of an arm 804), holes 816, or the like. In the depicted embodiment, initial arm selection pinning sites 810 are successively deeper notches (with increasing pinning strengths) in successive arms. For example, the initial arm selection pinning site 810*a* for the second arm 804*b* is deeper than any of the notches in the first arm 804*a*, the initial arm selection pinning site 810*b* for the third arm 804*c* is deeper than the initial arm selection pinning site 810*a* for the second arm 804*b*, and the initial arm selection pinning site 810*c* for the fourth arm 804*d* is deeper than the initial arm selection pinning site 810*b* for the third arm 804*c*. Thus increasing write currents will result in saturation of the first arm 804*a*, then the second arm 804*b*, then the third arm 804*c*, then the fourth arm 804*d*. Various further embodiments of free layers 800 may include various further numbers of arms 804 extending at various angles from a nucleation region 802, various numbers pinning sites 806, 808, 810, 816 of different sizes and shapes.

Figure 9:
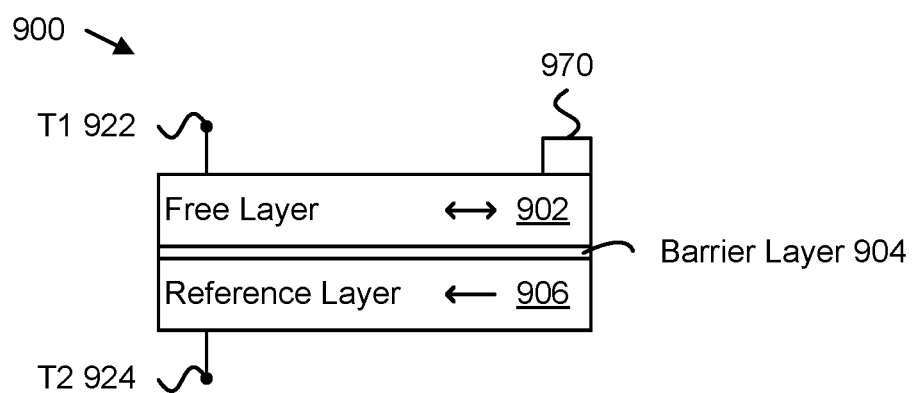
FIG. 9 is a schematic block diagram illustrating a further embodiment of a magnetic tunnel junction.

FIG. 9 depicts another embodiment of a magnetic tunnel junction (MTJ) 900. The MTJ 900, in certain embodiments may be a magnetic memory cell, or may be part of a magnetic memory cell (e.g., in an MRAM die 150, a neuromorphic computing die 450, or the like). In the depicted embodiment, the MTJ 900 may be substantially similar to the MTJ 500 described above with reference to FIG. 5, and may include a magnetic storage layer or free layer 902, a barrier layer 904, a reference layer 906, and two terminals 922, 924, substantially as described above. In the depicted embodiment, the MTJ 900 includes a domain stabilization layer 970.

As described above, data may be written to an MTJ 900 by setting or changing the magnetic state of the free layer 902, relative to the reference layer 906, so that the resistance state of the MTJ 900 (e.g., the electrical resistance between terminal T1 922 and terminal T2 924) is affected. In various embodiments, one or more resistance states for the MTJ 900 correspond to one or more positions of a magnetic domain wall within the free layer 902. For example, as described above with reference to FIGS. 6A-8, applying a write current to move a domain wall may change the resistance state of the MTJ 900. Additionally, in certain embodiments, a domain may be expanded (or a domain wall moved) so that a domain magnetized parallel or antiparallel to the reference layer 906 expands to saturate the free layer 902. For example, in the embodiment depicted in FIGS. 6A-6D, the highest and lowest resistance states for an MTJ correspond to saturated states of the free layer, fully antiparallel or fully parallel to the reference layer.

In certain embodiments, applying a write current in a first direction may move a domain wall in one direction in the free layer 902, and applying a write current opposite to the first direction may move a domain wall in an opposite direction in the free layer 902. Thus, in various embodiments, changes between intermediate resistance states for an MTJ 900 may be reversed by reversing a write current. For example, with reference to FIGS. 6A-6D, the change from the state represented in FIG. 6B to the state represented in FIG. 6C may be reversible by applying a write current in the reverse direction.

However, in a saturated state where no domain wall exists in the free layer, a write current may cause a domain wall to form in a nucleation region of the free layer. Thus, in certain embodiments, a change from an intermediate state with a domain wall to a saturated state with no domain wall may not be directly reversible by application of a reverse write current, because the reverse current may cause a domain wall to form at a location other than where the domain wall was located in the former intermediate state. For example, with reference to FIGS. 6A-6D, the change from the state represented in FIG. 6C, with an antiparallel domain at the end of the wall extension region 604, to the saturated parallel state represented in FIG. 6D may not be directly reversible, because reversing the write current would cause an antiparallel domain to form at the nucleation region 602, not at the end of the wall extension region 604. Rather, returning to the state represented in FIG. 6C would involve erasing the MTJ back to the saturated antiparallel state depicted in FIG. 6A, then forming and expanding a parallel domain as depicted in FIGS. 6B-6C.

Thus, in the depicted embodiment, the MTJ 900 includes a domain stabilization layer 970 coupled to a portion of the free layer 902, and configured to prevent migration of the domain wall into the coupled portion of the free layer. In various embodiments, preventing a domain wall from moving into a stabilized portion of the free layer may facilitate reversible write operations. For example, in FIGS. 6A-6D, if a portion of the free layer 600 at the end of the arm or wall extension region 602 was stabilized to prevent migration of a domain wall 650 into that portion of the arm, then the change between the state represented in FIG. 6C and the state represented in FIG. 6D would be reversible, because a domain wall would still exist in the latter state, and could be moved in the reverse direction. In certain embodiments, providing MTJs 900 with reversible write operations may allow the MTJs 900 to be used in "write in place" memory arrays that allow data to be directly overwritten" rather than in "erase before write" memory arrays where the write process involves a potentially lengthy erase operation prior to writing new data.

In certain embodiments, a domain stabilization layer 970 may be a layer of an MTJ 900 or magnetic memory cell in addition to the free layer 902, the reference layer 906, and the barrier layer 904. In further embodiments, the area of a domain stabilization layer 970 may be less than the area of the MTJ 900. In various embodiments, the domain stabilization layer 970 may be formed or deposited over (or under) only certain portions of the free layer 902, and may not have the same boundary as the free layer 902. For example, in the depicted embodiment it may be seen that the domain stabilization layer 970 is deposited over a portion of the free layer 902 at the right side of FIG. 9, and that other portions of the free layer 902 are not directly in contact with the domain stabilization layer 970.

In various embodiments, a domain stabilization layer 970 may be formed or deposited by various techniques such as physical vapor deposition, sputtering, or the like. In various embodiments, a domain stabilization layer 970 may be coupled to a portion of the free layer 902 in various ways. For example, a manufacturer may couple a domain stabilization layer 970 to a portion of the free layer 902 by forming the domain stabilization layer 970 and the portion of the free layer 902 in direct contact. In another embodiment, a domain stabilization layer 970 may be magnetically coupled to a portion of the free layer 902 without directly contacting the portion of the free layer 902 (e.g., by using ruthenium or iridium spacer as an interface). Various ways to couple a domain stabilization layer 970 to a portion of the free layer 902 will be clear in view of this embodiment.

In various embodiments, coupling a domain stabilization layer 970 to a portion of a free layer 902 of an MTJ 900 may prevent migration of the domain wall into the coupled portion of the free layer 902, which may be referred to herein as the "coupled portion" the "stabilized portion," or the like. In certain embodiments, preventing migration of a domain wall into the coupled portion of the free layer 902 may provide a fixed magnetization for the coupled portion of the free layer 902, similar to the fixed magnetization of the reference layer 906 (e.g., substantially constant, at least in orientation, when the magnetization of the rest of the free layer 502 is changed). In various embodiments, the domain stabilization layer 970 may provide a fixed magnetization for the coupled portion of the free layer 902, or may prevent migration of the domain wall into the coupled portion of the free layer 902, in various ways. For example, the domain stabilization layer 970 may pin the magnetization of the coupled portion by exchange coupling (similar to the pinning of a reference layer 906 by a synthetic antiferromagnet), may induce a coercivity increase of the coupled portion, or the like. Further types of materials or techniques used to provide a fixed magnetization for the reference layer 906 may similarly be used for or with the domain stabilization layer 970 to provide a fixed magnetization for the coupled portion of the free layer 902. Various other or further ways to configure a domain stabilization layer 970 to provide a fixed magnetization for a coupled portion of the free layer 902 will be clear in view of this disclosure.

In certain embodiments, the domain stabilization layer 970 may be configured to prevent migration of the domain wall into the coupled portion of the free layer 902 by stabilizing a magnetization direction for the coupled portion of the free layer 902. In various embodiments, stabilizing a magnetization direction may include maintaining a stable or substantially constant direction or orientation of magnetization in the coupled portion. For example, a magnetization direction may be stabilized by inducing a unidirectional anisotropy in the stabilized direction, inducing a coercivity increase in of the stabilized portion, or the like. Certain further embodiments of domain stabilization layers 970 that stabilize a magnetization direction for a portion of the free layer 902 are discussed below with reference to FIGS. 12A-12C.

FIGS. 10A-10D depict top views of a free layer 1000 for a magnetic tunnel junction 900 or multi-state magnetic memory cell, in various resistance states. The free layer 1000 may be substantially similar to the free layers 502, 600, 700, 800, 902 described above with reference to previous figures, and may include a nucleation region 1002, a wall extension region 1004 or arm, and pinning sites 1006, 1008 for pinning a domain wall 1050, which may be substantially similar to the nucleation regions 602, wall extension region 604, and pinning sites 606, 608 for pinning a domain wall 650 described above with reference to FIGS. 6A-6D. As in FIGS. 6A-6D, further layers of an MTJ 900 such as a barrier layer 504 or a reference layer 506 are not shown, for convenience in depiction, but would nevertheless be present in an embodiment of an MTJ 900. Additionally, in the depicted embodiment, an MTJ 900 includes a domain stabilization layer 1070, which may be substantially similar to the domain stabilization layer 970 described above with reference to FIG. 9. The domain stabilization layer 1070 is represented as a dashed outline in the top view of the free layer 1000 FIGS. 10A-10D, in the depicted embodiment, indicating that the domain stabilization layer 1070 may be positioned vertically above or below the free layer 1000, rather than in the same plane.

As in FIGS. 6A-6D, arrows in FIGS. 10A-10D represent the magnetization of the free layer 1000, with the magnetization of the fixed or reference layer 906 is to the right of the Figure, so that a left-pointing arrow represents an antiparallel state for a free layer 1000, or for a domain within the free layer 1000, and so that a right-pointing arrow represents a parallel state for a free layer 1000, or for a domain within the free layer 1000. However, the depicted and described magnetizations are for exemplary purposes, and are not intended as limiting. For example, a magnetization for a reference layer 906 may be in another in-plane or perpendicular direction, with corresponding parallel and antiparallel directions in the free layer 1000. FIGS. 10A through 10D depict resistance states in descending order from a high resistance state in FIG. 10A to a lower resistance state in FIG. 10D.

Figure 10A:
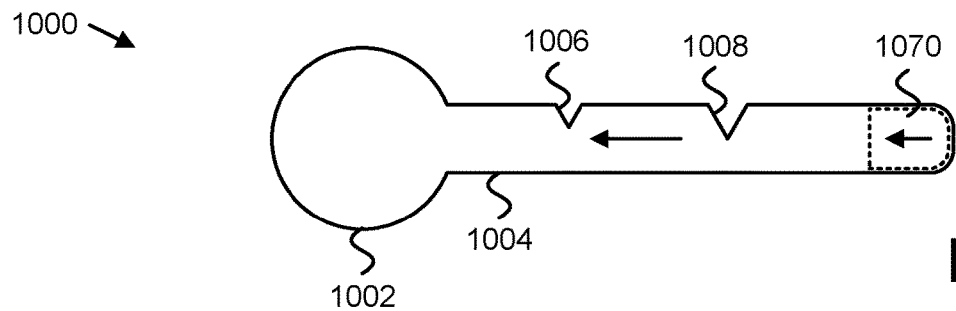
FIG. 10A is a top view illustrating one embodiment of a free layer for a magnetic tunnel junction, in a first resistance state.

In FIG. 10A, the free layer 1000 is magnetized as a single domain, antiparallel to the magnetic moment of the reference layer 906. In the depicted embodiment, the single-domain free layer 1000 has an antiparallel magnetic moment, corresponding to a high resistance state for the MTJ 900. In certain embodiments, a write current from a controller, such as the die controller 206, may control a magnetic field applied to the free layer 1000, or a spin current injected into the free layer 1000. A new, parallel-magnetized domain, and domain wall 1050, may form in the nucleation region 1002 in response to the write current, and migrate to a pinning site 1006.

Figure 10B:
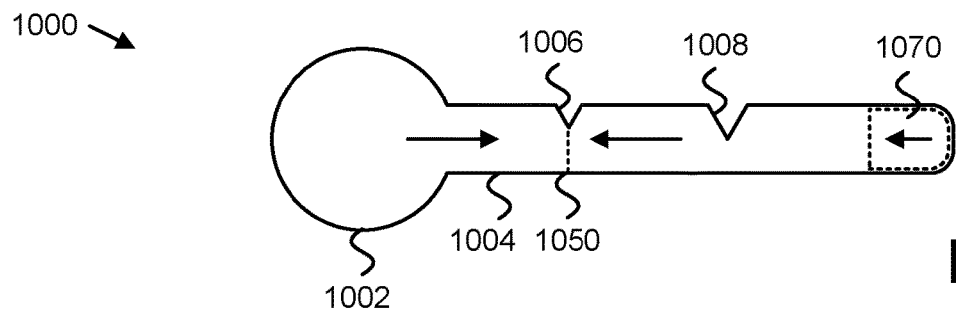
FIG. 10B is a top view illustrating the free layer of FIG. 10A, in a second resistance state.

In FIG. 10B, the newly-formed domain has expanded in response to the write current, saturating the nucleation region 1002, and expanding until a domain wall 1050 is pinned at the first pinning site 1006. Thus, the nucleation region 1002 and the wall extension region 1004 out to the first pinning site 1006 are now magnetized parallel to the reference layer 906. The remainder of the wall extension region 1004 remains magnetized antiparallel to the reference layer 906, and the free layer 1000 includes two different domains. The volume ratio between the parallel and antiparallel domains determines the resistance of the MTJ 900. Because the fraction of parallel-magnetized volume has increased relative to the high resistance state of FIG. 10A, the resistance of the MTJ 900 has decreased in FIG. 10B In FIG. 10C, the parallel-magnetized domain has expanded in response to an increased write current from the controller. The increased write current has unpinned the domain wall 1050 from the first pinning site 1006, and expanded the parallel-magnetized domain to the second pinning site 1008. Thus, the nucleation region 1002 and the wall extension region 1004 out to the second pinning site 1008 are now magnetized parallel to the reference layer 906, and the remainder of the wall extension region 1004 beyond the second pinning site 1008 remains magnetized antiparallel to the reference layer 906. Because the fraction of parallel-magnetized volume has increased relative to the state depicted in FIG. 10B, the resistance of the MTJ 900 has further decreased in FIG. 10C.

Figure 10C:
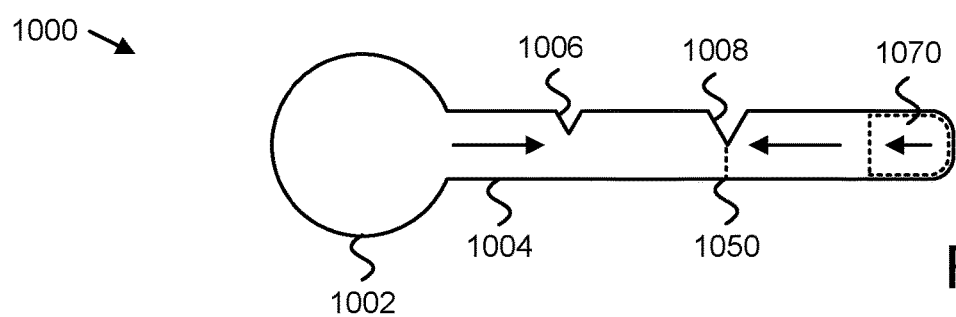
FIG. 10C is a top view illustrating the free layer of FIG. 10A, in a third resistance state.
Figure 10D:
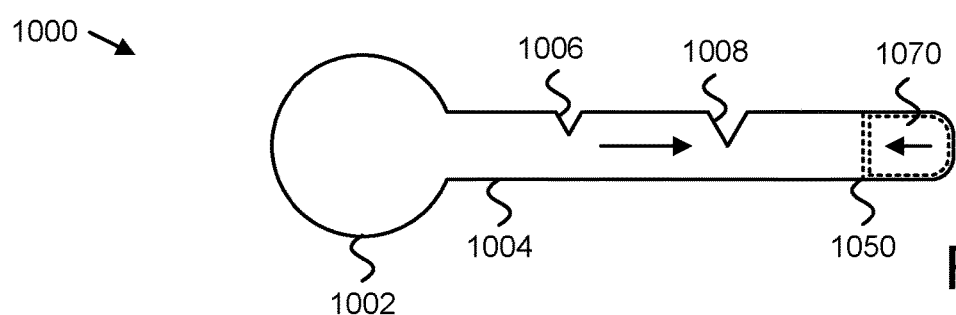
FIG. 10D is a top view illustrating the free layer of FIG. 10A, in a fourth resistance state.

In FIG. 10D, the parallel-magnetized domain has further expanded in response to an increased write current from the controller. The increased write current has unpinned the domain wall 1050 from the second pinning site 1008, and further expanded the parallel-magnetized domain. However, the domain stabilization layer 1070 has prevented migration of the domain wall 1050 into the end portion of the wall extension region 1004. Because the domain wall 1050, in the depicted embodiment, is excluded from the end region by the domain stabilization layer 1070, the parallel-magnetized domain does not expand to saturate the wall extension region 1004. However, the domain wall 1050 has moved from the second pinning site 1008 to the boundary of the end region with the rest of the wall extension region 1004, thus further increasing the fraction of parallel-magnetized volume relative to the state depicted in FIG. 10C, and further decreasing the resistance of the MTJ 900.

However, unlike in FIG. 6D, a domain wall 1050 remains present in the low-resistance state depicted in FIG. 10D. Thus, in certain embodiments including a domain stabilization layer 1070, if a subsequent data value corresponding to the third resistance state shown in FIG. 10C is written to the MTJ 900, while the MTJ is in the low resistance state shown in FIG. 10D, the controller may apply a reverse write current to expand the remaining antiparallel-magnetized domain, moving the domain wall 1050 back to the second pinning site 1008 so that the MTJ 900 returns to the resistance state depicted in FIG. 10C.

By contrast, if the free layer 1000 were to be saturated in a parallel-magnetized state, as in FIG. 6D, applying a reverse write current would result in formation of an antiparallel-magnetized domain at the nucleation region 1002, rather than at the end of the wall extension region 1004. Subsequently, continuing to apply the reverse current to expand the antiparallel-magnetized domain until a domain wall 1050 was pinned at the second pinning site 1008 would result in the domain wall 1050 being at the same position as in FIG. 10C, but with the antiparallel-magnetized domain to the left, and the parallel-magnetized domain to the right, thus resulting in a different fraction of parallel-magnetized volume than in FIG. 10C, and a different resistance state for the MTJ 900. Returning to the state depicted in FIG. 10C would involve further application of the reverse current to expand the antiparallel-magnetized domain to saturate the free layer 1000, returning to the high resistance state depicted in FIG. 10A (e.g., erasing the MTJ 900), before then forming a new parallel magnetized domain and expanding it to return to the state depicted in FIG. 10C.

Accordingly, in various embodiments, using a domain stabilization layer 1070 to prevent migration of a domain wall 1050 into a coupled portion of the free layer 1000 may provide reversible write operations, allowing the data states of the MTJ 900 to be directly overwritten without first returning the MTJ 900 to an erased state. (Data may also be written after erasing the MTJ 900, but the possibility of omitting an erase operation may facilitate faster writing.) For example, a controller may increase the resistance state of the MTJ 900 by applying a first write current to move a domain wall 1050 in a first direction, and/or may decrease the resistance state of the MTJ by applying a second write current in a direction opposite to the first write current, to move the domain wall 1050 in a second direction opposite to the first direction.

FIGS. 11A-11I depict another embodiment of a free layer 1102 and domain stabilization layer(s) 1170 for a magnetic tunnel junction 900, in a side view. In the depicted embodiment, the free layer 1102 may be substantially similar to the free layer 902 described above with reference to FIG. 9, the free layer 1000 described above with reference to FIGS. 10A-10D, or the like, and the domain stabilization layer(s) 1170 may be substantially similar to the domain stabilization layer 970 described above with reference to FIG. 9 and/or the domain stabilization layer 1070 described above with reference to FIG. 10.

For convenience in depiction, other layers of an MTJ 900 such as a barrier layer 904 and a reference layer 906 are not shown, but would nevertheless be present in an embodiment of an MTJ 900. In FIGS. 11A-11I, arrows within the free layer 1102 represent magnetization at different locations within the free layer 1102. Arrows within the domain stabilization layers 1170 represent a stabilized magnetization direction for the coupled portions of the free layer 1102. For example, a down arrow in domain stabilization layer 1170a indicates that the magnetization of the portion of the free layer 1102 coupled to the domain stabilization layer 1170a is stabilized in the downward direction. However, the arrows in the domain stabilization layers 1170 are not intended to indicate the magnetization of the domain stabilization layers 1170 themselves. For example, the domain stabilization layer 1170a itself may be antiferromagnetic, magnetized in the upward direction, or the like, to provide a stabilized downward magnetization for the coupled portion of the free layer 1102.

In various embodiments, a free layer may include a wall extension region 1195, as described above. In the depicted embodiment, the wall extension region 1195 is an elongate arm, which may be substantially similar to the wall extension region 1004 of FIGS. 10A-10D. In various embodiments, a wall extension region 1195 may include pinning sites formed at predetermined locations, for pinning a domain wall. In another embodiment, a wall extension region may include locations where a domain wall may be pinned by randomly formed defects or discontinuities. In one embodiment, as depicted in FIGS. 10A-10D, one or more wall extension regions may be coupled to a nucleation region configured to form a domain wall. In the depicted embodiment, however, a nucleation region is not provided. Rather, in the depicted embodiment, the wall extension region 1195 extends between two end regions 1190 of the free layer. For example, in one embodiment, the free layer 1102 may include or be formed as an elongate arm, with the wall extension region 1195 as a middle portion of the arm, including pinning sites, and end regions 1190 as end portions of the arm. In the depicted embodiment, a first end region 1190a is a first end portion of the arm, and the second end region 1190b is a second end portion of the arm, and an opposite end of the arm from the first end region 1190a.

An "end" of a free layer 1102 may refer to a boundary or periphery of the free layer 1102, in a possible direction of domain wall movement, such that a domain expanding to the "end" results in saturation of the free layer 1102, or in elimination of a domain wall. Similarly, an "end portion" may refer to a portion or region of the free layer 1102 encompassing the "end" of the free layer 1102. For example, in a free layer 1000 with an elongate arm, an end portion may be a region at an end of the arm. In certain embodiments, an end region may be configured to exclude a domain wall 1150 in various ways. For example, in one embodiment, high coercivity material deposited in an end region may exclude the domain wall 1150. In the depicted embodiment, an end region 1190 may be configured to exclude a domain wall 1150 due to a domain stabilization layer 1170 being coupled to the end region 1190, and preventing migration of the domain wall 1150 into the end region 1190. In another embodiment, an end region 1190 may be configured to exclude a domain wall 1150 in another way.

In the depicted embodiment, a first domain stabilization layer 1170a prevents migration of a domain wall 1150 into the first end region 1190a, and a second domain stabilization layer 1170b prevents migration of a domain wall 1150 into a second end region 1190b. In the depicted embodiment, magnetization of the free layer 1102 is depicted in a perpendicular orientation (e.g., substantially perpendicular to the surface of the free layer 1102), with the magnetization of the fixed or reference layer 906 to the top of the Figure, so that an up-pointing arrow represents a parallel magnetization within the free layer 1102, and so that a down-pointing arrow represents an antiparallel magnetization within the free layer 1102. Thus, in FIGS. 11A-11I, the free layer 1102 includes an antiparallel-magnetized domain depicted to the left of the domain wall 1150, and a parallel-magnetized domain depicted to the right of the domain wall 1150. However, the depicted and described magnetizations are for exemplary purposes, and are not intended as limiting. For example, a magnetization for a reference layer 906 may be in another in-plane or perpendicular direction, with corresponding parallel and antiparallel directions in the free layer 1102.

In certain embodiments, a first domain stabilization layer 1170a and a second domain stabilization layer 1170b may be in the same physical layer, in the same plane as each other, or at substantially similar vertical distances from a substrate. However, the first domain stabilization layer 1170a and the second domain stabilization layer 1170b may be separate or distinct regions, so that the first domain stabilization layer 1170a is not in direct contact with the second domain stabilization layer 1170b. In one embodiment, multiple domain stabilization layers 1170 may be deposited at the same time in distinct locations using lithographic techniques, deposited as a single layer of material and then formed as distinct regions by removal of some of the deposited material, deposited at different times or in separate processes, or the like.

In certain embodiments, where two or more domain stabilization layers 1170 are configured to prevent migration of a domain wall 1150 into two or more end regions 1190 of a free layer 1102, the domain stabilization layers 1170 may stabilize two different end regions 1190 in opposite magnetization directions. For example, in the depicted embodiment, the first domain stabilization layer 1170a stabilizes the magnetization of the coupled first end region 1190a in the antiparallel orientation, and the second domain stabilization layer 1170b stabilizes the magnetization of the coupled second end region 1190b in the parallel orientation. In one embodiment, stabilizing magnetization of a region of a free layer 1102 in an antiparallel orientation may prevent a parallel-magnetized domain from expanding to saturate the free layer 1102. Correspondingly, in certain embodiments, stabilizing magnetization of a region of a free layer 1102 in a parallel orientation may prevent an antiparallel-magnetized domain from expanding to saturate the free layer 1102. Accordingly, in some embodiments, stabilizing magnetization of two different regions of a free layer 1102 in opposite orientations may prevent the free layer 1102 from becoming saturated in a fully antiparallel state and from becoming saturated in a fully parallel state. Thus, in various embodiments, providing two or more domain stabilization layers 1170 that stabilize magnetization of different regions of a free layer 1102 in opposite orientations may maintain the existence of at least one domain wall 1150 by preventing saturation. In certain embodiments, therefore, with two or more domain stabilization layers 1170 providing or maintaining a domain wall 1150, a nucleation region may be omitted from the free layer.

Figure 11A:
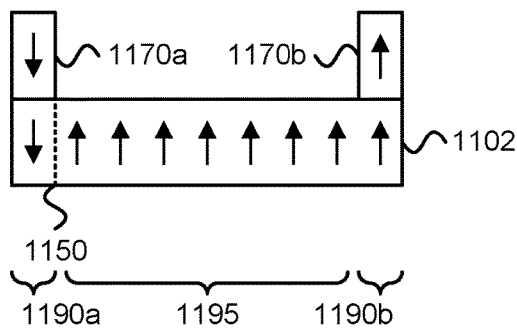
FIG. 11A is a side view illustrating another embodiment of a free layer for a magnetic tunnel junction, in a first resistance state.
Figure 11B:
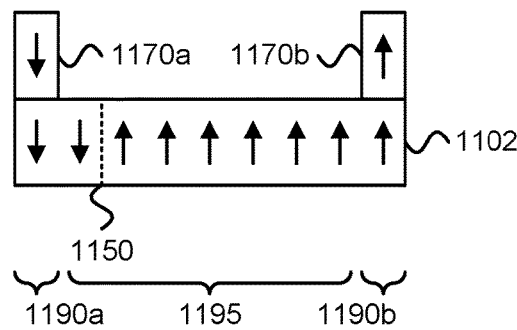
FIG. 11B is a side view illustrating the free layer of FIG. 11A, in a second resistance state.
Figure 11C:
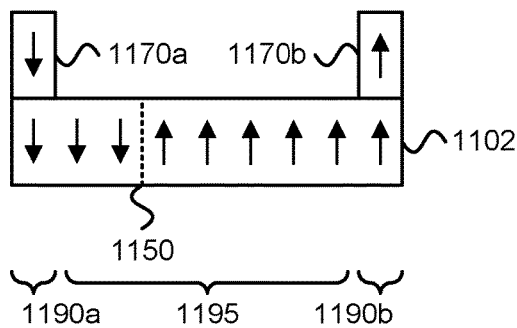
FIG. 11C is a side view illustrating the free layer of FIG. 11A, in a third resistance state.
Figure 11D:
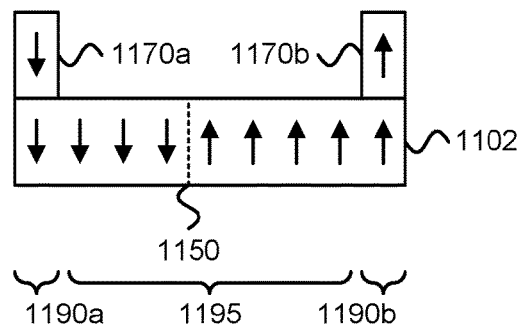
FIG. 11D is a side view illustrating the free layer of FIG. 11A, in a fourth resistance state.
Figure 11E:
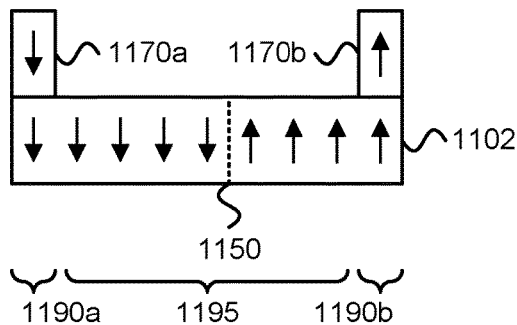
FIG. 11E is a side view illustrating the free layer of FIG. 11A, in a fifth resistance state.
Figure 11F:
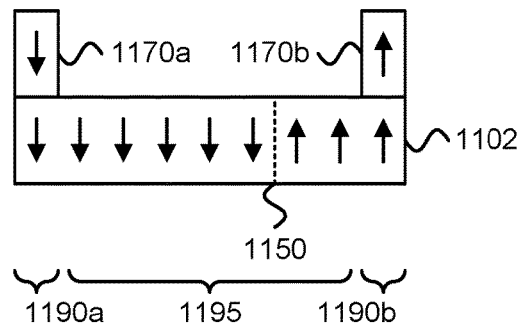
FIG. 11F is a side view illustrating the free layer of FIG. 11A, in a sixth resistance state.
Figure 11G:
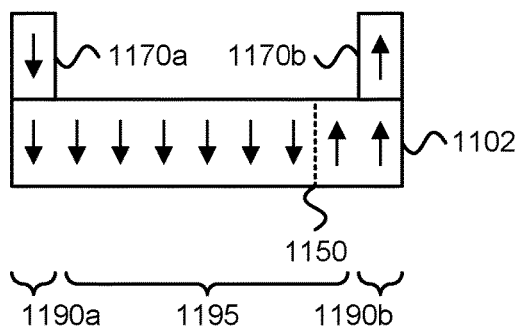
FIG. 11G is a side view illustrating the free layer of FIG. 11A, in a seventh resistance state.
Figure 11H:
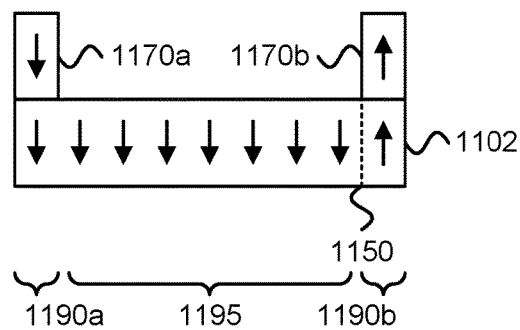
FIG. 11H is a side view illustrating the free layer of FIG. 11A, in an eighth resistance state.
Figure 11I:
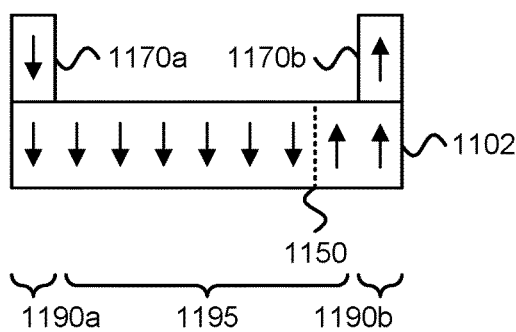
FIG. 11I is a side view illustrating the free layer of FIG. 11A, returned to the seventh resistance state.

FIGS. 11A through 11H depict resistance states in ascending order from a low resistance state in FIG. 11A to a higher resistance state in FIG. 11H. In FIG. 11A, the free layer 1102 includes a parallel-magnetized domain occupying the wall extension region 1195 and the second end region 1190b, and an antiparallel-magnetized domain occupying only the first end region 1190a, which is stabilized in the antiparallel orientation by the first domain stabilization layer 1170a. Because the first domain stabilization layer 1170a prevents the domain wall 1150 from entering the first end region 1190a, the fraction of parallel-magnetized volume in the free layer 1102 cannot increase further, and the MTJ 900 is therefore in its lowest resistance state.

In FIGS. 11B through 11G the controller has applied successive write currents in the same direction for the MTJ 900, causing the antiparallel-magnetized domain to expand as the domain wall 1150 unpins and repins within the wall extension region. FIGS. 11B through 11G depict the domain wall 1150 pinned at different locations within the wall extension region 1195, corresponding to intermediate resistance states for the MTJ 900, as the antiparallel-magnetized domain expands. Thus, as the fraction of parallel-magnetized volume in the free layer 1102 decreases, the resistance of the MTJ 900 increases, and each of the states depicted in FIGS. 11B-11G represents an increase in resistance from the immediately preceding figure.

In FIG. 11H, the controller has applied a further write current in the same direction as in FIGS. 11B through 11G, and the antiparallel-magnetized domain expand, moving the domain wall 1150 further to the right. However, in the depicted embodiment, the second domain stabilization layer 1170b is coupled to the second end region 1190b of the free layer 1102, and prevents the domain wall 1150 from migrating into the second end region 1190b, thus stabilizing the second end region 1190b in the parallel orientation. Because the second domain stabilization layer 1170b prevents the domain wall 1150 from entering the second end region 1190b, the fraction of antiparallel-magnetized volume in the free layer 1102 cannot increase further, and the MTJ 900 is therefore in its highest resistance state.

Additionally, in the depicted embodiment, the controller may apply a write current in another direction to move the domain wall 1150 in another direction. For example, in FIG. 11I, the controller has applied a write current in the opposite direction (relative to the previous Figures), and the domain wall 1150 has moved to the left instead of to the right, as the parallel-magnetized domain expands, returning the MTJ 900 from its highest resistance state to the intermediate resistance state of FIG. 11G. In a further embodiment, further application of a reversed write current would move the domain wall 1150 further to the left, to previous intermediate states. Thus, because the domain stabilization layers 1170 maintain the domain wall 1150 by preventing saturation, write operations for the MTJ 900 may be directly reversible without a prior erase operation, allowing the MTJ 900 to be used for write-in-place memory.

FIGS. 12A-12C depict various embodiments of a domain stabilization layer 1270, which may be substantially similar to the domain stabilization layer(s) 970, 1070, 1170 described above with reference to previous figures. In certain embodiments, as depicted in FIGS. 12A and 12B, a domain stabilization layer 1270 may be, or include, a multilayer. In various embodiments, a multilayer may include a plurality of sublayers. For example, in various embodiments, a multilayer may be a bilayer with two sublayers, a superlattice of alternating (or otherwise periodically repeating) layers, or the like.

FIG. 12A depicts one embodiment of a domain stabilization layer 1270a. In the depicted embodiment, the domain stabilization layer 1270a is a cobalt/platinum multilayer, including alternating cobalt layers 1202 and platinum layers 1204. In certain embodiments, parameters of the cobalt layers 1202 and platinum layers 1204, such as the thickness of individual layers, the number of repeating layers, or the like, may be selected or controlled during manufacturing to stabilize the magnetization direction in a coupled portion of a free layer 902 of an MTJ 900.

FIG. 12B depicts another embodiment of a domain stabilization layer 1270b. In the depicted embodiment, the domain stabilization layer 1270b is a cobalt/palladium multilayer, including alternating cobalt layers 1202 and palladium layers 1206. As in the cobalt/platinum multilayer 1270a of FIG. 12A, parameters of the cobalt/palladium multilayer 1270b such as the thickness of individual layers, the number of repeating layers, or the like, may be selected or controlled during manufacturing to stabilize the magnetization direction in a coupled portion of a free layer 902 of an MTJ 900.

In certain embodiments, a domain stabilization layer 1270 including a multilayer, such as a cobalt/platinum multilayer 1270a, a cobalt/palladium multilayer 1270b or the like, may be configured to induce a coercivity increase in the portion of the free layer 902 coupled to the domain stabilization layer 1270. In certain embodiments, increasing the coercivity of a portion of the free layer 902 may stabilize a magnetization direction in that portion, by reducing the effect of a write current on the stabilized portion. Various further types of multilayers suitable for inducing a coercivity increase in a portion of the free layer 902 will be clear in view of this disclosure.

FIG. 12C depicts another embodiment of a domain stabilization layer 1270c. In the depicted embodiment, the domain stabilization layer 1270c comprises an antiferromagnetic layer. In various embodiments, an antiferromagnetic layer or material may include a material in which individual microscopic magnetic moments are anti-aligned (as represented by anti-aligned arrows in FIG. 12C), resulting in a zero or approximately zero magnetic moment. In the depicted embodiment, the domain stabilization layer 1270c comprises a layer of antiferromagnetic material. In another embodiment, an antiferromagnetic layer may be a synthetic antiferromagnet, including two or more anti-aligned ferromagnetic sublayers.

In various embodiments, an antiferromagnetic layer for a domain stabilization layer 1270c may be configured to induce a unidirectional magnetic anisotropy in a coupled portion of the free layer 902. A unidirectional magnetic anisotropy may refer to an "easy" or energetically favorable direction of magnetization for the coupled portion of the free layer, so that the coupled portion is more readily magnetized in one direction than in other directions. For example, in one embodiment, an antiferromagnetic layer may induce a unidirectional magnetic anisotropy for a coupled portion of the free layer 902 due to pinning of magnetic spins in the free layer 902 by exchange coupling with the antiferromagnetic layer. In certain embodiments, inducing a unidirectional magnetic anisotropy for a portion of the free layer 902 may stabilize a magnetization direction in that portion by "pinning" the magnetization in the "easy" or energetically favorable direction. Various further ways to configure an antiferromagnetic layer to induce a unidirectional magnetic anisotropy for a coupled portion of the free layer 902 will be clear in view of this disclosure.

Figure 13:
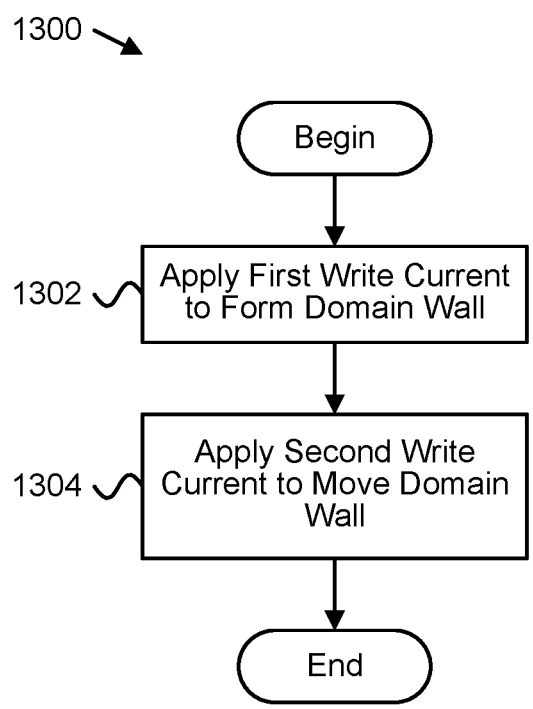
FIG. 13 is a schematic flow chart diagram illustrating one embodiment of a method for writing data to magnetoresistive memory.

FIG. 13 is a schematic flow chart diagram illustrating one embodiment of a method 1300 for writing data to magnetoresistive random access memory. The method 1300 begins, and a controller 206 applies 1302 a first write current to an MTJ 500 to form a domain wall in a nucleation region of the free layer 502. The domain wall may migrate to a first pinning site in the free layer 502. The controller 206 applies 1304 a second write current to move the domain wall from the first pinning site to a second pinning site in the free layer 502, and the method 1300 ends.

Figure 14:
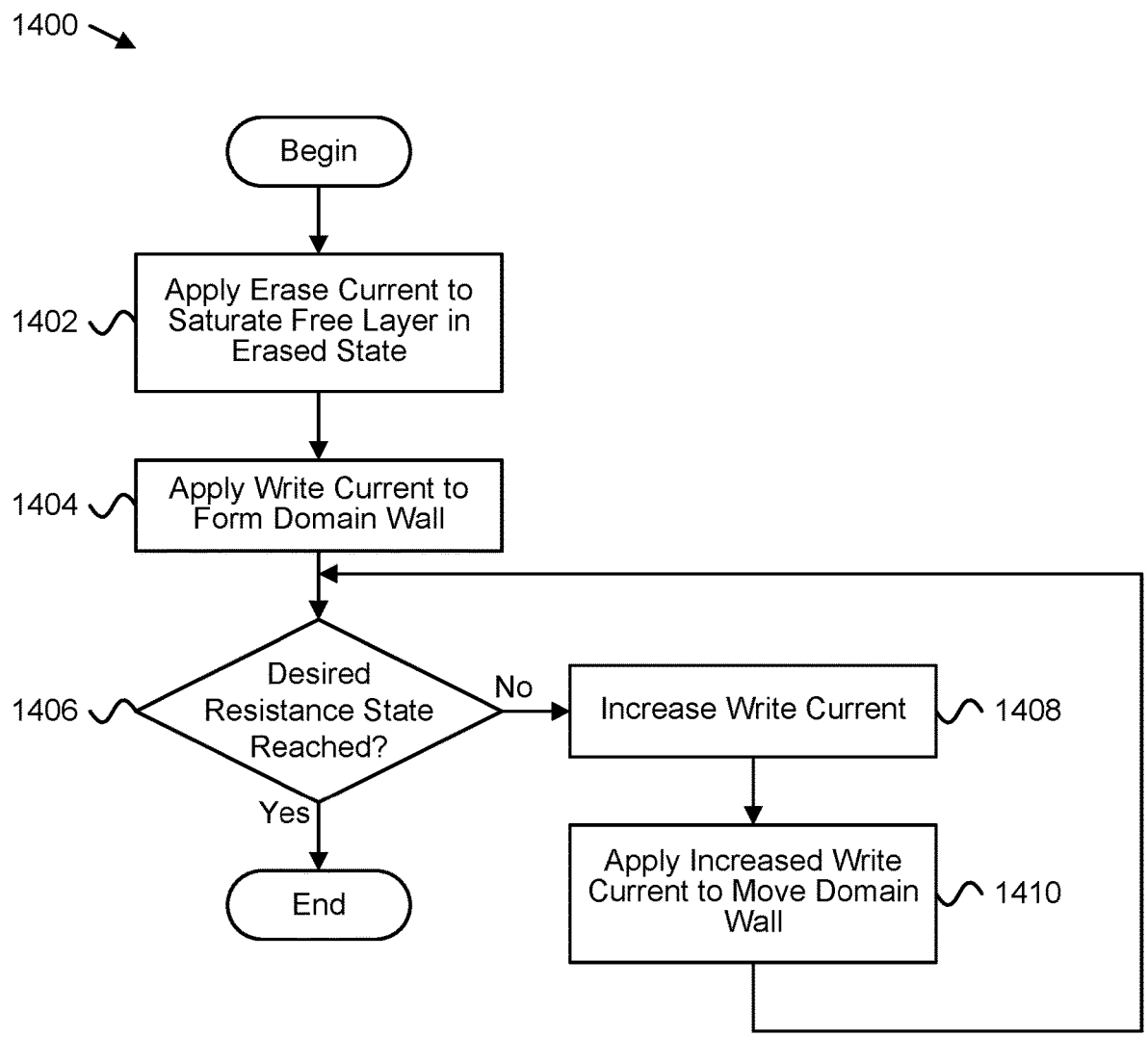
FIG. 14 is a schematic flow chart diagram illustrating another embodiment of a method for writing data to magnetoresistive memory.

FIG. 14 is a schematic flow chart diagram illustrating one embodiment of a method 1400 for writing data to magnetoresistive random access memory. The method 1400 begins, and a controller 206 applies 1402 an erase current to an MTJ 500 to magnetically saturate the free layer 502 in an erased state with no domain wall. The erased state may be a parallel or antiparallel state. The controller 206 applies 1404 a write current to form a domain wall in the free layer 502. The controller 206 determines 1406 if a desired resistance state for the MTJ 500 (corresponding to a data value to be programmed to the MTJ 500) has been reached. If the MTJ 500 is in the desired resistance state, the method 1400 ends.

If the MTJ 500 is not in the desired resistance state, the controller 206 increases 1408 the write current, and applies 1410 the increased write current to move the domain wall in the free layer 502. The controller again determines 1406 if the desired resistance state for the MTJ 500 has been reached, and accordingly either continues the method 1400 by increasing 1408 the write current, or ends the method 1400.

Figure 15:
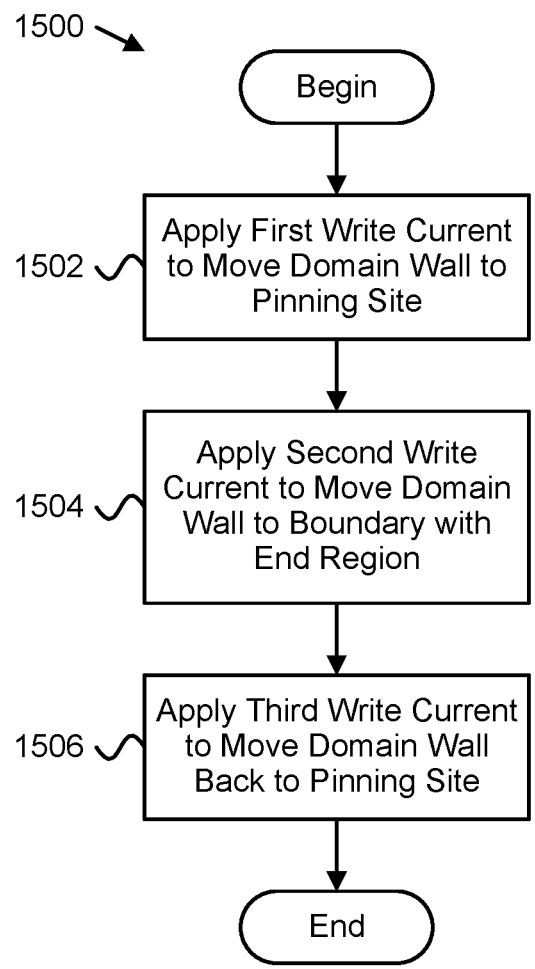
FIG. 15 is a schematic flow chart diagram illustrating another embodiment of a method for writing data to magnetoresistive memory.

FIG. 15 is a schematic flow chart diagram illustrating another embodiment of a method 1500 for writing data to magnetoresistive memory. The method 1500 begins, and a controller 206 applies 1502 a first write current to an MTJ 900 to move a domain wall to a pinning site, in a wall extension region of a free layer of the MTJ 900. In certain embodiments, moving a domain wall to a pinning site may set a resistance state for the MTJ 900, storing a data value that corresponds to the resistance state. The controller 206 applies 1504 a second write current to the MTJ 900 to move the domain wall from the pinning site to a boundary between the wall extension region and an end region of the free layer 902. In certain embodiments, moving the domain wall to a boundary between a wall extension region and an end region that excludes the domain wall may set the MTJ 900 to a highest or lowest resistance state, storing a corresponding data value. The controller 206 applies 1506 a third write current to the MTJ 900 to move the domain wall back to the pinning site, and the method 1500 ends. In certain embodiments, applying the third write current may move the domain wall back to the pinning site without applying an erase current, so that a data value corresponding to an intermediate resistance state may overwrite a data value corresponding to a higher or lower resistance state.

A means for forming a magnetic domain wall in a free layer for a magnetic tunnel junction, in various embodiments, may include a nucleation region 602 of a free layer 600, a pad-shaped region 702 of a free layer 700, a center dot of a free layer, or the like. Other embodiments may include similar or equivalent means for forming a magnetic domain wall.

A means for pinning a domain wall at one or more predetermined locations along one or more arms in a free layer, in various embodiments, may include one or more pinning sites, one or more notches, one or more gaps, holes, or formed irregularities in the arms, or the like. Other embodiments may include similar or equivalent means for pinning a domain wall A means for moving a magnetic domain wall in a free layer for a magnetic tunnel junction, in various embodiments, may include a controller 206, row circuits 202, column circuits 204, row/axon circuits 402, column/dendrite circuits 404, or the like, other logic hardware, and/or executable code stored on a computer readable medium. Other embodiments may include similar or equivalent means for moving a magnetic domain wall.

A means for preventing a magnetic domain wall from entering a portion of a free layer, in various embodiments, may include one or more domain stabilization layers 970, a multilayer, a cobalt/platinum multilayer 1270a, a cobalt/palladium multilayer 1270b, an antiferromagnetic layer 1270c, or the like. Other embodiments may include similar or equivalent means for preventing a magnetic domain wall from entering a portion of a free layer.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

We claim:

1. An apparatus comprising:
a magnetoresistive random access memory (MRAM) die, the MRAM die comprising a plurality of memory cells, a memory cell comprising a fixed layer, a barrier layer, and a free layer, the barrier layer disposed between the fixed layer and the free layer, the free layer comprising:
a wall extension region configured to provide a plurality of resistance states for the memory cell corresponding to positions of a magnetic domain wall within the wall extension region; and
an end region configured to exclude the domain wall.

2. The apparatus of claim 1, further comprising a domain stabilization layer coupled to the end region of the free layer, the domain stabilization layer configured to stabilize a magnetization direction for the end region of the free layer.

3. The apparatus of claim 2, wherein the domain stabilization layer comprises an antiferromagnetic layer.

4. The apparatus of claim 3, wherein the antiferromagnetic layer is configured to induce a unidirectional magnetic anisotropy in a portion of the free layer.

5. The apparatus of claim 2, wherein the domain stabilization layer comprises a multilayer.

6. The apparatus of claim 5, wherein the multilayer comprises one or more of: a cobalt/platinum multilayer and a cobalt/palladium multilayer.

7. The apparatus of claim 5, wherein the multilayer is configured to induce a coercivity increase in a portion of the free layer.

8. The apparatus of claim 2, wherein the domain stabilization layer is configured to prevent migration of the domain wall into a portion of the free layer by stabilizing a magnetization direction for the portion of the free layer.

9. The apparatus of claim 2, further comprising a second domain stabilization layer configured to prevent migration of the domain wall into a second portion of the free layer, wherein the free layer comprises an elongate arm comprising a plurality of pinning sites for pinning the domain wall, the portion of the free layer comprises a first end portion of the arm, and the second portion of the free layer comprises a second end portion of the arm opposite to the first end portion.

10. The apparatus of claim 1, wherein the free layer comprises:
a nucleation region configured to form the magnetic domain wall; and
an arm extending from the nucleation region, the arm comprising a plurality of pinning sites for pinning the domain wall.

11. The apparatus of claim 1, further comprising a controller configured to increase the resistance state of a selected one of the memory cells by applying a first write current to move the domain wall in a first direction.

12. The apparatus of claim 11, wherein the controller is further configured to decrease the resistance state of the selected one of the memory cells by applying a second write current in a direction opposite to the first write current, to move the domain wall in a second direction opposite to the first direction.

13. The apparatus of claim 1, wherein the free layer further comprises a nucleation region configured to form the magnetic domain wall in response to a write current.

14. The apparatus of claim 13, further comprising a controller configured to apply the write current to a selected one of the memory cells.

15. The apparatus of claim 13, further comprising a plurality of pinning sites formed at predetermined locations in the wall extension region and configured to pin the domain wall such that the domain wall migrates from one pinning site to another pinning site in response to a changed write current.

16. The apparatus of claim 12, wherein the controller is further configured to, subsequent to applying the second write current, increase the resistance state of the selected one of the memory cells by applying a third write current in the direction of the first write current to move the domain wall in the first direction.

17. The apparatus of claim 16, wherein the controller is further configured to apply the third write current to move the domain wall without applying an erase current.

18. The apparatus of claim 1, wherein the memory cells are configured to store weights of a neural network.

19. The apparatus of claim 18, further comprising a controller configured to:
receive a plurality of inputs apply a plurality of inputs for a neural network;
perform a multiplication of the inputs with the weights of the neural network stored in the memory cells; and
perform a summation of results of the multiplication.

* * * * *